(12) United States Patent
Kim et al.

(10) Patent No.: US 9,608,117 B2
(45) Date of Patent: Mar. 28, 2017

(54) SEMICONDUCTOR DEVICES INCLUDING A FINFET

(71) Applicant: Samsung Electronics Co., Ltd., Suwon-si, Gyeonggi-do (KR)

(72) Inventors: Jin-Bum Kim, Seoul (KR); Nam Kyu Kim, Yongin-si (KR); Hyun-Ho Noh, Hwaseong-si (KR); Dong-Chan Suh, Suwon-si (KR); Byeong-Chan Lee, Yongin-si (KR); Su-Jin Jung, Hwaseong-si (KR); Jin-Yeong Joe, Suwon-si (KR); Bon-Young Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/049,859

(22) Filed: Feb. 22, 2016

(65) Prior Publication Data

US 2016/0293750 A1 Oct. 6, 2016

(30) Foreign Application Priority Data

Mar. 30, 2015 (KR) ........................ 10-2015-0044546

(51) Int. Cl.
*H01L 29/76* (2006.01)
*H01L 29/78* (2006.01)
(Continued)

(52) U.S. Cl.
CPC ........ *H01L 29/785* (2013.01); *H01L 29/0649* (2013.01); *H01L 29/16* (2013.01); *H01L 29/7856* (2013.01)

(58) Field of Classification Search
CPC H01L 29/785; H01L 29/7856; H01L 29/0649
(Continued)

(56) References Cited

U.S. PATENT DOCUMENTS

| 7,867,860 B2 | 1/2011 | Huang et al. |
| 8,450,775 B2 | 5/2013 | Chong et al. |

(Continued)

FOREIGN PATENT DOCUMENTS

| JP | 2011-103434 | 5/2011 |
| JP | 2013-506291 | 2/2013 |

(Continued)

*Primary Examiner* — Anthony Ho
(74) *Attorney, Agent, or Firm* — Myers Bigel, P.A.

(57) ABSTRACT

A semiconductor device includes an active fin structure extending in a first direction, the active fin structure including protruding portions divided by a recess, a plurality of gate structures extending in a second direction crossing the first direction and covering the protruding portions of the active fin structure, a first epitaxial pattern in a lower portion of the recess between the gate structures, a second epitaxial pattern on a portion of the first epitaxial pattern, the second epitaxial pattern contacting a sidewall of the recess, and a third epitaxial pattern on the first and second epitaxial patterns, the third epitaxial pattern filling the recess. The first epitaxial pattern includes a first impurity region having a first doping concentration, the second epitaxial pattern includes a second impurity region having a second doping concentration lower than the a first doping concentration, and the third epitaxial pattern includes a third impurity region having a third doping concentration higher than the second doping concentration. The semiconductor device may have good electrical characteristics.

20 Claims, 22 Drawing Sheets

(51) Int. Cl.
*H01L 29/16* (2006.01)
*H01L 29/06* (2006.01)

(58) Field of Classification Search
USPC .......................................... 257/288
See application file for complete search history.

(56) References Cited

U.S. PATENT DOCUMENTS

| | | |
|---|---|---|
| 8,629,426 B2 | 1/2014 | Lin et al. |
| 8,853,039 B2 | 10/2014 | Tsai et al. |
| 2009/0242989 A1 | 10/2009 | Chan et al. |
| 2010/0252816 A1 | 10/2010 | Ko et al. |
| 2010/0252862 A1 | 10/2010 | Ko et al. |
| 2011/0068396 A1 | 3/2011 | Cheng et al. |
| 2011/0316044 A1 | 12/2011 | Chan et al. |
| 2014/0038402 A1 | 2/2014 | Wei et al. |
| 2014/0264590 A1 | 9/2014 | Yu et al. |
| 2014/0335674 A1 | 11/2014 | Liao et al. |
| 2016/0308004 A1* | 10/2016 | Lee .................... H01L 29/0847 |

FOREIGN PATENT DOCUMENTS

| | | |
|---|---|---|
| KR | 1020110052432 | 5/2011 |
| KR | 2013-0028941 | 3/2013 |

* cited by examiner

SEMICONDUCTOR DEVICES INCLUDING A FINFET

CROSS-REFERENCE TO RELATED APPLICATION

This application claims priority under 35 U.S.C §119 to Korean Patent Application No. 10-2015-0044546, filed on Mar. 30, 2015 in the Korean Intellectual Property Office (KIPO), the disclosure of which is herein incorporated by reference in its entirety.

BACKGROUND

1. Technical Field

Example embodiments relate to a semiconductor device and a method of manufacturing of the same. More particularly, example embodiments relate to a semiconductor device including a finFET and a method of manufacturing the same.

2. Description of the Related Art

A semiconductor device including a finFET may include an epitaxial structure in a source/drain region. The epitaxial structure may be formed in a recess, and a channel length of the finFET may be varied according to a shape of the recess. Thus, a portion of an active fin under a gate structure may not serve as an effective channel.

SUMMARY

Example embodiments provide a semiconductor device including a FinFET.

According to example embodiments, there is provided a semiconductor device. The semiconductor device is formed on a substrate, and the semiconductor device includes an active fin structure, a plurality of gate structures, a first epitaxial pattern, a second epitaxial pattern and a third epitaxial pattern. The active fin extends in a first direction and includes protruding portions divided by a recess. The gate structures extend in a second direction crossing the first direction, and cover the protruding portions of the active fin structure. The first epitaxial pattern is formed in a lower portion of the recess between the gate structures. The second epitaxial pattern is formed on a portion of the first epitaxial pattern, and contacts a sidewall of the recess. The third epitaxial pattern is formed on the first and second epitaxial patterns, and fills the recess. The first epitaxial pattern includes a first impurity region having a first doping concentration. The second epitaxial pattern includes a second impurity region having a second doping concentration lower than the first doping concentration. The third epitaxial pattern includes a third impurity region having a third doping concentration higher than the second doping concentration.

In some embodiments, the recess may have an upper portion and a lower portion, and the upper portion may have a width greater than a width of the lower portion.

In some embodiments, each of the first, second and third epitaxial patterns may include silicon-germanium, and wherein the first, second and third epitaxial patterns may include germanium having a first germanium concentration, a second germanium concentration and a third germanium concentration, respectively.

In some embodiments, each of the first and second germanium concentrations may be lower than the third germanium concentration.

In some embodiments, each of a difference between the first germanium concentration and the third germanium concentration and a difference between the second germanium concentration and the third germanium concentration may be less than about 30%.

In some embodiments, each of the first and second germanium concentration may be in range of about 5% to about 50%.

In some embodiments, each of the first and second germanium concentration may be in range of about 30% to about 80%.

In some embodiments, the third doping concentration may be substantially the same as or higher than the first doping concentration.

In some embodiments, the first, second and third impurity regions may include p-type impurities.

In some embodiments, each of the protruding portions of the active fin structure may include a first portion of which a sidewall may be covered by an isolation layer, and a second portion on the first portion, and wherein a top surface of the first epitaxial pattern may be higher than a bottom of the second portion, and may be lower than a central portion of the second portion in a vertical direction.

In some embodiments, a leakage blocking layer may be further formed on a bottom of the recess, and the leakage blocking layer may include silicon oxide.

In some embodiments, the leakage blocking layer may have a thickness of about 3 Å to about 50 Å.

In some embodiments, the second epitaxial pattern may be conformally formed on the sidewall of the recess and a top surface of the first epitaxial pattern, and wherein a portion of the second epitaxial pattern on the sidewall of the recess may have a first thickness, and a portion of the second epitaxial pattern on the top surface may have a second thickness less than the first thickness.

In some embodiments, the second epitaxial pattern may be formed only on the sidewall of the recess.

In some embodiments, a capping layer may be further formed on surfaces of the second and third epitaxial pattern, and the capping layer may include single crystalline silicon.

According to example embodiments, there is provided a semiconductor device. The semiconductor device is formed on a substrate, and the semiconductor device includes an active fin structure, a plurality of gate structures, a first epitaxial pattern, a second epitaxial pattern and a third epitaxial pattern. The active fin structure extends in a first direction, and includes protruding portions divided by a recess. The gate structures extend in a second direction crossing the first direction, and cover the protruding portions of the active fin structure. The first epitaxial pattern is formed in a lower portion of the recess between the gate structures. The second epitaxial pattern is formed on a portion of the first epitaxial pattern. The second epitaxial pattern contacts a sidewall of the recess. The third epitaxial pattern is formed on the first and second epitaxial patterns. The third epitaxial pattern fills the recess. Each of the first, second and third epitaxial patterns includes silicon-germanium, and wherein a concentration of the germanium in the third epitaxial pattern is higher than a concentration of the germanium in each of the first and second epitaxial patterns.

In some embodiments, a leakage blocking layer may be further formed on a bottom of the recess. The leakage blocking layer may include silicon oxide.

In some embodiments, each of the protruding portions of the active fin structure may include a first portion of which a sidewall may be covered by an isolation layer, and a second portion on the first portion. A top surface of the first epitaxial pattern may be higher than a bottom of the second portion, and may be lower than a central portion of the second portion in a vertical direction.

In some embodiments, the recess may have an upper portion and a lower portion, and the upper portion may have a width greater than a width of the lower portion.

According to example embodiments, there is provided a semiconductor device. The semiconductor device is formed on a substrate, and the semiconductor device includes an active fin structure, a plurality of gate structures, a first epitaxial pattern, a second epitaxial pattern and a third epitaxial pattern. The active fin structure extends in a first direction, and includes protruding portions divided by a recess. The gate structures extend in a second direction crossing the first direction, and cover the protruding portions of the active fin structure. The first epitaxial pattern is formed in a lower portion of the recess between the gate structures. The second epitaxial pattern is formed on a portion of the first epitaxial pattern. The second epitaxial pattern contacts a sidewall of the recess. The third epitaxial pattern is formed on the first and second epitaxial patterns. The third epitaxial pattern fills the recess. The first, second and third epitaxial patterns include a first impurity region, a second impurity region and a third impurity region, respectively. An impurity concentration of the second impurity region is lower than an impurity concentration of each of the first and third impurity regions.

According to example embodiments, the semiconductor device may include an epitaxial structure including a first epitaxial pattern, a second epitaxial pattern and a third epitaxial pattern. The first epitaxial pattern may be formed at a lower portion to have a high doping concentration of impurities, so that an electrical resistance between a channel region and the first epitaxial layer may decrease during an operating of a finFET. Thus, the channel region of the finFET may be also formed at a lower portion of the active fin. The third epitaxial pattern may include germanium of a high concentration, so that a sufficient stress may be supplied to the channel region of the finFET from the third epitaxial pattern. Thus, the finFET may have desired charge mobility.

BRIEF DESCRIPTION OF THE DRAWINGS

Example embodiments will be more clearly understood from the following detailed description taken in conjunction with the accompanying drawings.

FIGS. 1 and 2 are a perspective view and a cross-sectional view, respectively, illustrating a semiconductor device including a FinFET in accordance with example embodiments;

FIG. 3 is a perspective view illustrating of a portion of the semiconductor device including the FinFET;

FIGS. 4 to 11 are cross-sectional views illustrating stages of a method of manufacturing a semiconductor device in accordance with example embodiments;

FIGS. 12 and 13 are a perspective view and a cross-sectional view, respectively, illustrating a semiconductor device including a FinFET in accordance with example embodiments;

FIG. 14 is a perspective view illustrating of a portion of the semiconductor device including the FinFET;

FIGS. 15 and 16 are cross-sectional views illustrating stages of a method of manufacturing a semiconductor device in accordance with example embodiments;

FIGS. 17 and 18 are a perspective view and a cross-sectional view, respectively, illustrating a semiconductor device including a FinFET in accordance with example embodiments;

FIG. 19 is a perspective view illustrating of a portion of the semiconductor device including the FinFET;

FIGS. 20 and 21 are cross-sectional views illustrating stages of a method of manufacturing a semiconductor device in accordance with example embodiments; and FIG. 22 is a block diagram illustrating a system in accordance with example embodiments.

DESCRIPTION OF EMBODIMENTS

Figure 1:
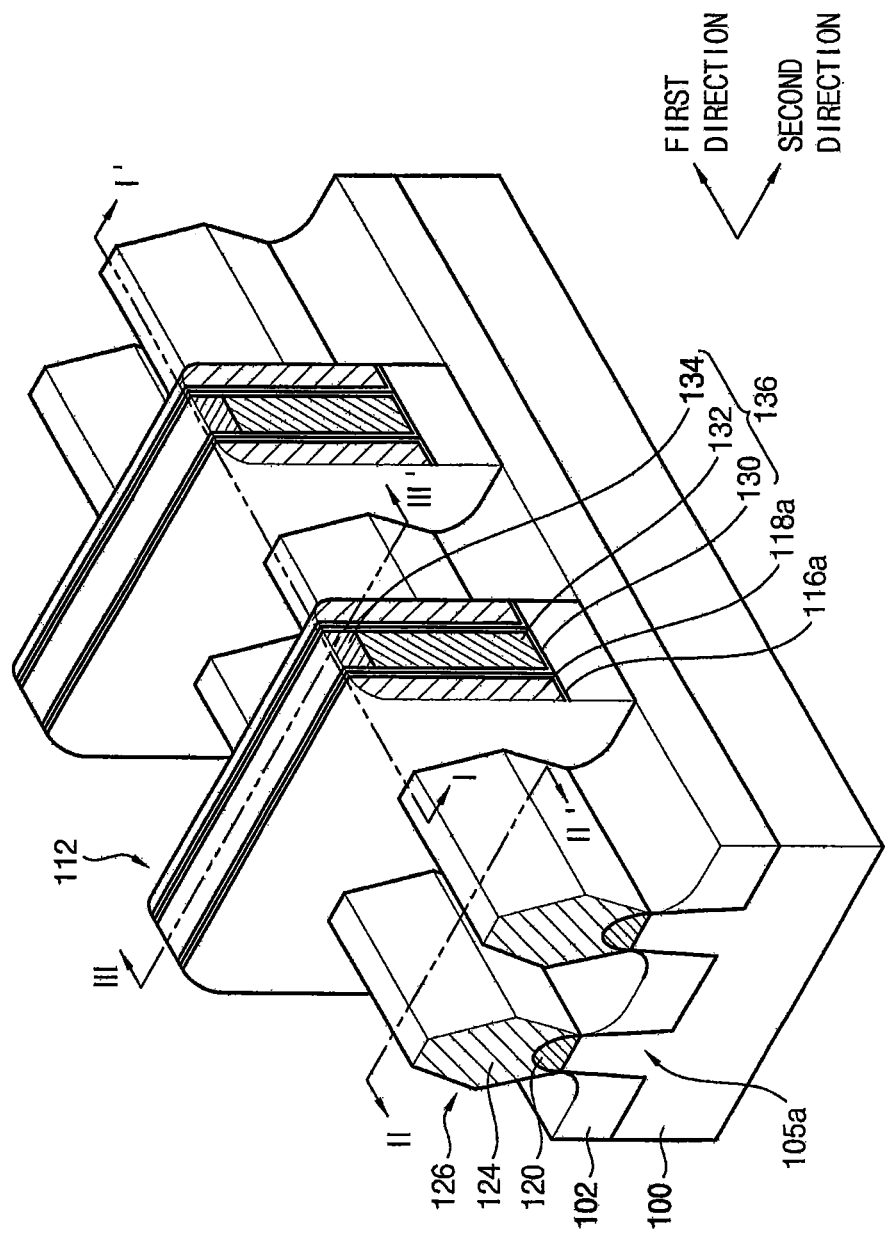
FIGS. 1 to 22 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional or perspective illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
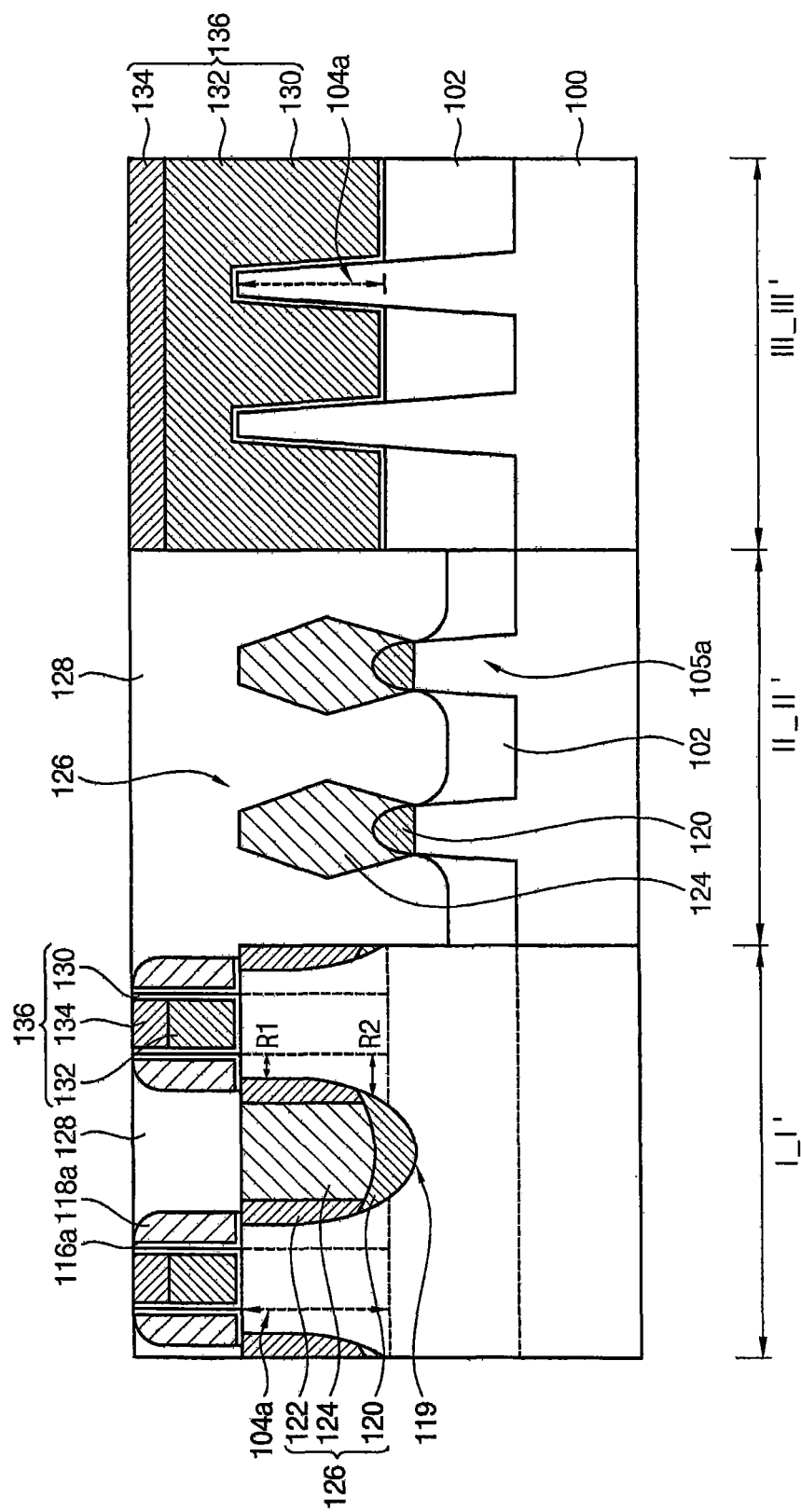
Figure 3:
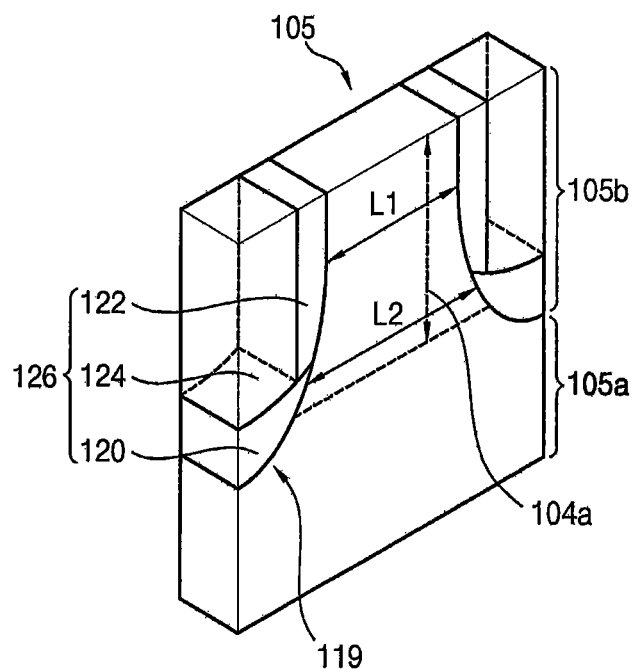

FIGS. 1 and 2 are a perspective view and a cross-sectional view, respectively, illustrating a semiconductor device including a FinFET in accordance with example embodiments. FIG. 3 is a perspective view illustrating of a portion of the semiconductor device including the FinFET. FIG. 2 includes cross-sectional views taken along lines I-I', II-II' and III-III', respectively, in FIG. 1. FIG. 3 illustrates portions of an active fin and an epitaxial structure of the semiconductor device in FIGS. 1 and 2.

Referring to FIGS. 1, 2 and 3, the semiconductor device may include a substrate 100, an active fin structure 105, a gate structure 136 and an epitaxial structure 126. The semiconductor device may further include an isolation layer 102 and a spacer structure.

The substrate 100 may include a semiconductor material, e.g., silicon. In some embodiments, the substrate 100 may be a silicon-on-insulator (SOI) substrate, a germanium-on-insulator (GOI) substrate, etc. The substrate 100 may have crystallinity, preferably, single crystallinity.

The active fin structure 105 may include a first pattern 105a extending in a first direction and a second pattern 105b protruding upwardly from a top surface of the first pattern 105a. The active fin structure 105 may include a material substantially the same as a material of the substrate 100. In some embodiments, a plurality of active fin structures 105 may be arranged in a second direction substantially perpendicular to the first direction.

A lower portion of the second pattern 105b may be covered by the isolation layer 102, and an upper portion thereof may not be covered by the isolation layer 102. The upper portion of the second pattern 105b may serve as an effective active region, and may be referred to as an active fin 104a. That is, the active fin 104a may be disposed at a height higher than a top surface of the isolation layer 102 under the gate structure 136.

In some embodiments, a plurality of second patterns 105b may be formed in the first direction, and a recess 119 may be formed between the second patterns 105b in the first direction. A bottom of the recess 119 may be lower than the top surface of the isolation layer 102 under the gate structure 136. In some embodiments, the recess 119 may have a depth of about 30 nm to about 1000 nm.

In some embodiments, a sidewall of the recess 119 may be also a sidewall of the active fin 104a. An upper portion of the recess 119 may have a width greater than a width of a lower portion of the recess 119. The bottom of the recess 119 may have a round shape. The width of the lower portion of the recess 119 may decrease (e.g., gradually decrease) toward the bottom of the recess 119.

In some embodiments, the active fin 104a may have a pillar shape, and a length of the active fin 104a in the first direction may be greater than a length thereof in the second direction. In some embodiments, a plurality of active fins 104a may be arranged both in the first and second directions, respectively.

In a cross-sectional view taken along the first direction, a sidewall of the upper portion of the active fin 104a may have a first slope, and a sidewall of the lower portion of the active fin 104a may have a second slope gentler than the first slope. In some embodiments, the first slope may be in a range of about 80° to about 90°. Thus, the upper portion of the active fin 104a may have a first width L1 in the first direction, and the lower portion of the active fin 104a may have a second width L2 in the first direction greater than the first width L1.

The isolation layer 102 may include an oxide, e.g., silicon oxide.

In some embodiments, the gate structure 136 may extend in the second direction, and cover a top surface and a sidewall of the active fin 104a, and a plurality of gate structures 136 may be formed in the first direction.

In some embodiments, the gate structure 136 may include a gate insulation pattern 130, a gate electrode 132 and a hard mask 134 sequentially stacked on the active fin 104a and the isolation layer 102.

In some embodiments, the gate insulation pattern 130 may include an oxide, e.g., silicon oxide, or a metal oxide having a dielectric constant higher than a dielectric constant of silicon oxide, e.g., hafnium oxide, tantalum oxide, zirconium oxide, etc. For example, the gate insulation pattern 130 may include a silicon oxide layer and a metal oxide layer sequentially stacked.

The gate electrode 132 may include a material having a low resistance, e.g., a metal such as aluminum, copper, tantalum, etc., or a metal nitride thereof. Alternatively, the gate electrode 132 may include, e.g., polysilicon. The hard mask 134 may include a nitride, e.g., silicon nitride.

The spacer structure may be formed on sidewalls of the gate structure 136, and may include a first spacer 116a and a second spacer 118a sequentially stacked. The first spacer 116a may have a first thickness, and may include, e.g., silicon nitride. The second spacer 118a may be formed on the first spacer 116a, and may have a second thickness greater than the first thickness. The second spacer 118a may include an insulating material having a dielectric constant lower than a dielectric constant of the first spacer 116a. When the first spacer 116a may include silicon nitride, the second spacer 118a may include, e.g., silicon oxycarbonitride (SiOCN).

The epitaxial structure 126 may be formed in the recess 119. The epitaxial structure 126 may protrude from the active fin 104a in the recess 119 in the second direction. In some embodiments, the epitaxial structure 126 may have a cross-section taken along the second direction of which a shape may be pentagon, hexagon, or rhombus.

In some embodiments, a plurality of epitaxial structures 126 disposed in the second direction may be spaced apart from each other. In some embodiments, the epitaxial structures 126 disposed in the second direction may be connected to each other to be merged into a single structure. In some embodiments, some of the epitaxial structures 126 may be spaced apart from each other in the second direction, and others of the epitaxial structures 126 may be connected to each other in the second direction.

Each of the epitaxial structures 126 may include a first epitaxial pattern 120, a second epitaxial pattern 122 and a third epitaxial pattern 124. Each of the first, second and third epitaxial patterns 120, 122 and 124 may include silicon-germanium. A strained stress may be applied to the active fin 104a from silicon-germanium in the epitaxial structures 126.

The epitaxial structures 126 may serve as source/drain regions of the FinFET, and may be doped with impurities.

The first epitaxial pattern 120 may fill the lower portion of the recess 119. The first epitaxial pattern 120 may have a first height from a bottom of the recess 119 in a third direction substantially perpendicular to a top surface of the substrate 100.

The first epitaxial pattern 120 may include silicon-germanium and may have a first germanium concentration. In some embodiments, the first germanium concentration may be in a range of about 5% to about 50%, preferably, in a range of about 5% to about 30%. When the first germanium concentration is more than about 50%, a lattice mismatch between silicon-germanium of the first epitaxial pattern 120 and silicon of the active fin structure 105 may increase, and thus lattice defects between the first epitaxial pattern 120 and active fin structure 105 may be generated. When the first germanium concentration is less than about 5%, the strained stress applied to the active fin 104a may be reduced.

The first epitaxial pattern 120 may include a first impurity region doped with impurities of a first doping concentration. That is, both of a surface and an inner portion of the first epitaxial pattern 120 may serve as the first impurity region. In some embodiments, the impurities may include boron, and the first doing concentration may be about $1E17/cm^3$ to about $1E22/cm^3$.

When a top surface of the first epitaxial pattern 120 is lower than a bottom of the active fin 104a, the effect of reducing an electrical resistance of a channel region by the first epitaxial pattern 120 may decrease. When the top surface of the first epitaxial pattern 120 is higher than a central portion of the active fin 104a in the third direction, a volume of the first epitaxial pattern 120 containing the small amount of germanium may increase, so that the strained stress applied to the active fin 104a may be reduced. Thus, the top surface of the first epitaxial pattern 120 may be located between the bottom of the active fin 104a and the central portion of the active fin 104a in the third direction. That is, the first epitaxial pattern 120 may contact a lower sidewall of the active fin 104a.

The second epitaxial pattern 122 may be formed on a portion of the first epitaxial pattern 120, and may be formed only on an upper sidewall of the recess 119. Thus, the second epitaxial pattern 122 may have a spacer shape.

The second epitaxial pattern 122 may include silicon-germanium and may have a second germanium concentration. In some embodiments, the second germanium concentration may be in a range of about 5% to about 50%, preferably, in a range of about 5% to about 30%. When the second germanium concentration is more than about 50%, a lattice mismatch between silicon-germanium of the second epitaxial pattern 122 and silicon of an upper sidewall of the active fin 104a may increase, and thus lattice defects between the second epitaxial pattern 122 and active fin 104a may be generated. When the second germanium concentration is less than about 5%, the strained stress applied to the active fin 104a may be reduced. In some embodiments, the second germanium concentration may be substantially the same as the first germanium concentration. In some embodiments, the second germanium concentration may be different from the first germanium concentration.

The second epitaxial pattern 122 may include a second impurity region doped with impurities of a second doping concentration lower than the first doping concentration. That is, both of a surface and an inner portion of the second epitaxial pattern 122 may serve as the second impurity region. In some embodiments, the impurities may include boron, and the second doing concentration may be about $1E15/cm^3$ to about $1E21/cm^3$. The second impurity region in the epitaxial structure 126 may have a doping concentration lower than a doping concentration of other impurity regions in the epitaxial structure 126.

The third epitaxial pattern 124 may be formed on the first and second epitaxial patterns 120 and 122, and may fill a remaining portion of the recess 119.

The third epitaxial pattern 124 may include silicon-germanium and may have a third germanium concentration higher than the first and second germanium concentrations. In some embodiments, the third germanium concentration may be in a range of about 30% to about 80%, preferably, in a range of about 50% to about 60%. When the third germanium concentration is less than about 30%, the strained stress applied to the active fin 104a may be reduced. When the third germanium concentration is more than about 80%, lattice defects may increase.

When each of a difference between the first and third germanium concentrations and a difference between the second and third germanium concentrations is more than about 30%, a strained stress between the first and third epitaxial patterns 120 and 124 and a strained stress between the second and third epitaxial patterns 122 and 124 may increase so that a lattice mismatch may occur. Thus, in some embodiments, each of the difference between the first and third germanium concentrations and the difference between the second and third germanium concentrations may be less than about 30%.

The third epitaxial pattern 124 may include a third impurity region doped with impurities of a third doping concentration higher than the second doping concentration. That is, both of a surface and an inner portion of the third epitaxial pattern 124 may serve as the third impurity region. In some embodiments, the impurities may include boron, and the second doing concentration may be about $1E17/cm^3$ to about $1E22/cm^3$. In some embodiments, the third doping concentration may be substantially the same as or higher than the first doping concentration. The third epitaxial pattern 124 may have a relatively high doping concentration, and thus a contact resistance between a contact plug and the third epitaxial pattern 124 therebeneath may decrease.

The active fin 104a, the gate structure 136 and the first, second and third impurity regions in the epitaxial structure 126 may serve as a finFET. When the first, second and third impurity regions are doped with, e.g., boron, the finFET may serve as a PMOS transistor. When the finFET is operated, a channel region may be formed at a surface of the active fin 104a covered by gate structure 136.

As described above, the second width L2 may be greater than the first width L1 in the active fin 104a. Thus, a channel length of the lower portion of the active fin 104a may be longer than a channel length of the upper portion of the active fin 104*a*. A first resistance R1 between a channel region of the upper portion of the active fin 104*a* and the epitaxial structure 126 may be lower than a second resistance R2 between a channel region of the lower portion of the active fin 104*a* and the epitaxial structure 126. Thus, the channel region may be easily formed at the upper portion of the active fin 104*a*, while the channel region may not be easily formed at the lower portion of the active fin 104*a*.

However, in some embodiments, the first epitaxial pattern 120 including the first impurity region may be formed on the lower portion of the active fin 104*a*, and the first impurity region may be highly doped with impurities to have the first doping concentration. Thus, the second resistance R2 between the channel region of the lower portion of the active fin 104*a* and the epitaxial structure 126 may decrease, so that an effective channel region may be formed at the lower portion of the active fin 104*a*.

Further, the second epitaxial pattern 122 including the second impurity region may be formed on the upper portion of the active fin 104*a*, and the second impurity region may be doped with impurities to have the second doping concentration lower than the first doping concentration. Thus, the effective channel region may be formed at the upper and lower portions of the active fin 104, so that an area of the effective channel region may increase and an operating current of the finFET may increase.

FIGS. 4 to 11 are cross-sectional views illustrating stages of a method of manufacturing a semiconductor device in accordance with example embodiments.

Figure 4:
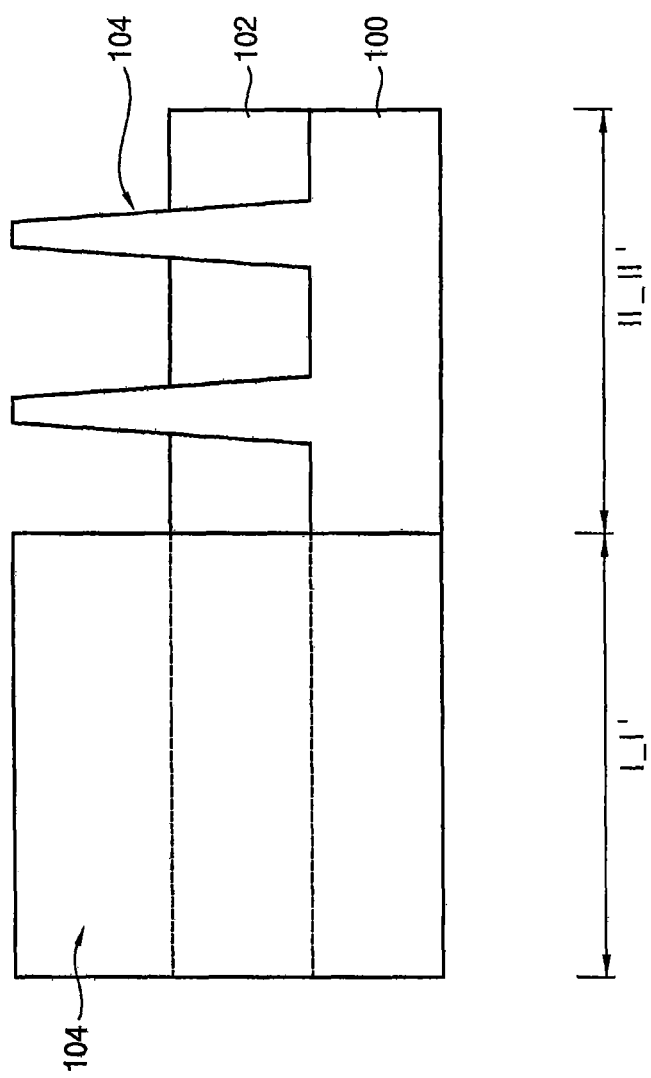

Referring to FIG. 4, an upper portion of a substrate 100 may be partially removed to form a trench extending in a first direction, and an isolation layer 102 may be formed on the substrate 100 to fill a lower portion of the trench.

Before forming the trench, impurities may be implanted into the substrate 100 to form a well region (not shown). In some embodiments, the well region may be doped with n-type impurities, e.g., phosphorus, arsenic, etc.

In some embodiments, the isolation layer 102 may be formed by forming an insulation layer on the substrate 100 to sufficiently fill the trench, planarizing the insulation layer until a top surface of the substrate 100 may be exposed, and removing an upper portion of the insulation layer to expose an upper portion of the trench. The insulation layer may be formed of an oxide, e.g., silicon oxide.

According as the isolation layer 102 is formed, a plurality of preliminary active fins 104 may be formed on the substrate 100 to extend in the first direction. In some embodiments, the preliminary active fins 104 may be arranged in a second direction substantially perpendicular to the first direction.

Figure 5:
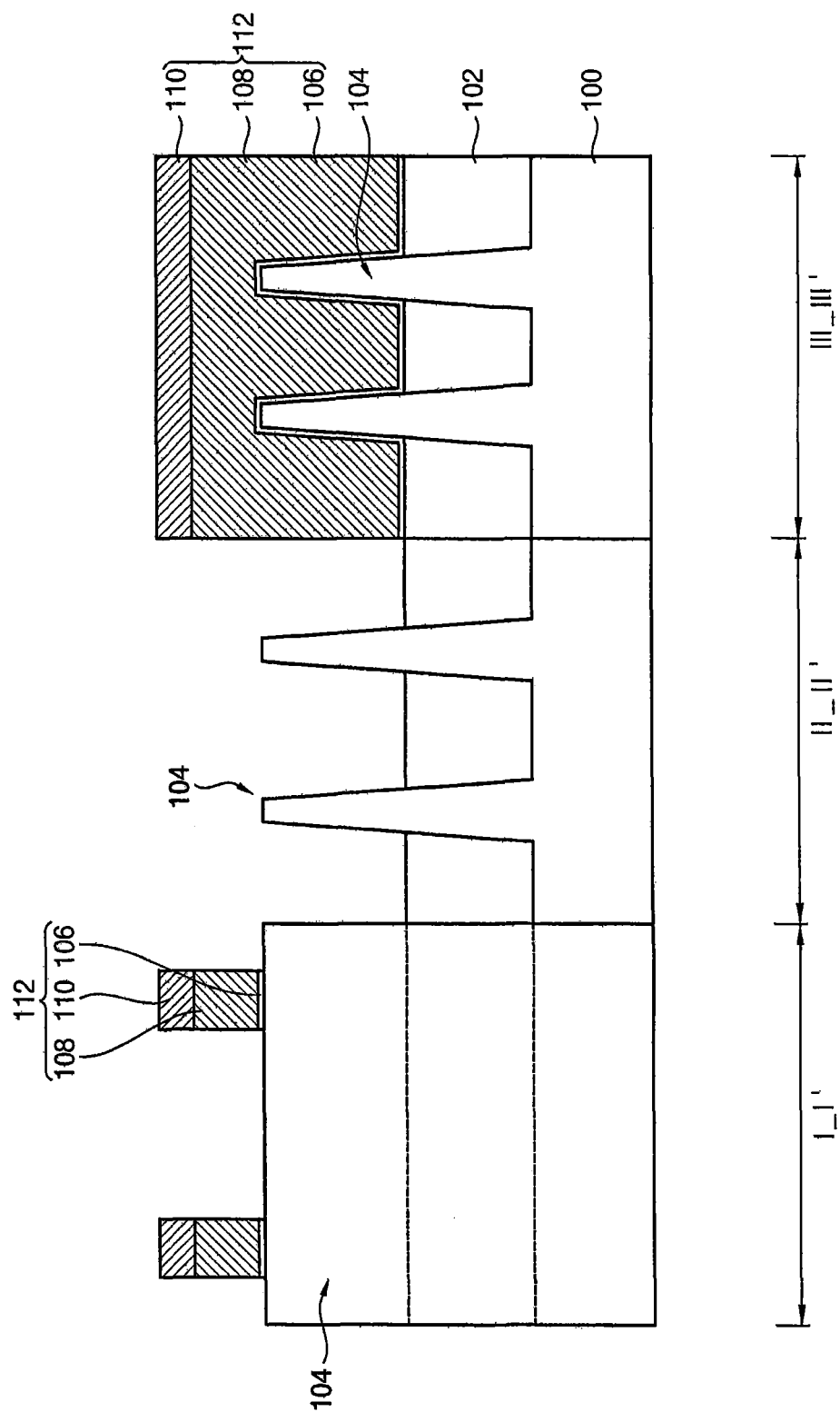

Referring to FIG. 5, a plurality of dummy gate structures 112 may be formed on the substrate 100.

The dummy gate structures 112 may be formed by sequentially stacking a dummy gate insulation layer, a dummy gate electrode layer and a hard mask layer on the preliminary active fins 104 and the isolation layer 102, patterning the hard mask layer by a photolithography process using a photoresist pattern (not shown) as an etching mask to form a hard mask 110, and sequentially etching the dummy gate electrode layer and the dummy gate insulation layer using the hard mask 110 as an etching mask. Thus, each of the dummy gate structures 112 may be formed to include a dummy gate insulation pattern 106, a dummy gate electrode 108 and the hard mask 110 sequentially stacked.

The dummy gate insulation layer may be formed of an oxide, e.g., silicon oxide, the dummy gate electrode layer may be formed of, e.g., polysilicon, and the hard mask layer may be formed of a nitride, e.g., silicon nitride. The dummy gate insulation layer may be formed by a chemical vapor deposition (CVD) process, an atomic layer deposition (ALD) process, etc. In some embodiments, the dummy gate insulation layer may be formed by a thermal oxidation process on an upper portion of the substrate 100. The dummy gate electrode layer and the hard mask layer may be also formed by a CVD process, an ALD process, etc.

In some embodiments, each of the dummy gate structures 112 may be formed to extend in the second direction on the preliminary active fins 104 and the isolation layer 102, and the plurality of dummy gate structures 112 may be formed at a given distance from each other in the first direction.

Figure 6:
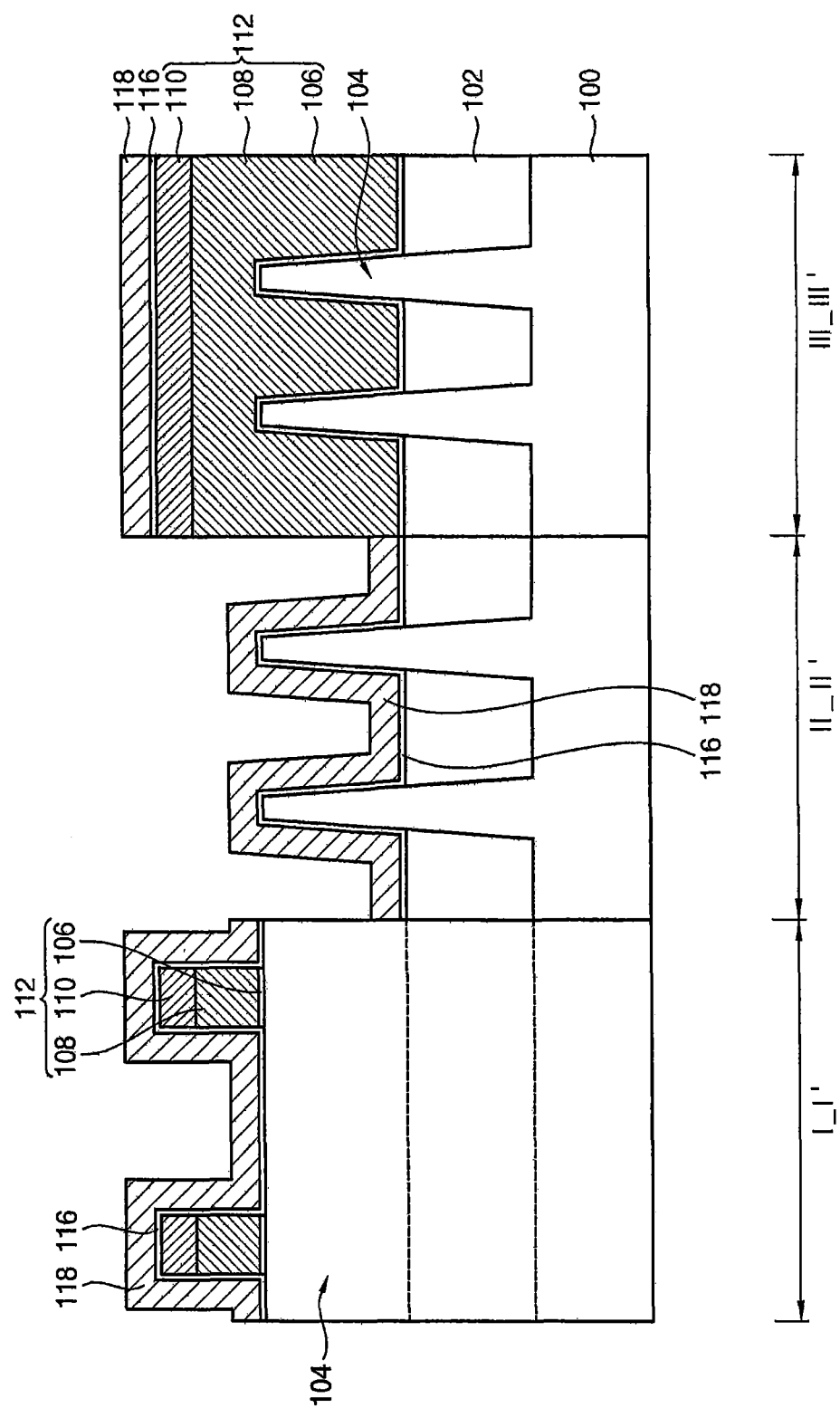

Referring to FIG. 6, a spacer layer may be formed on the dummy gate structures 112, the isolation layer 102 and the preliminary active fins 104. The spacer layer may have a single layer or a multi-layered structure. In some embodiments, the spacer layer may include a first spacer layer 116 and a second spacer layer 118 sequentially stacked.

The first spacer layer 116 may be conformally formed on the dummy gate structures 112, the isolation layer 102 and the preliminary active fins 104. The first spacer layer 116 may be formed to have a first thickness. The first spacer layer 116 may be formed of a nitride, e.g., silicon nitride. The second spacer layer 118 may be formed on the first spacer layer 116. The second spacer layer 118 may be formed of an insulating material having a dielectric constant lower than a dielectric constant of the first spacer layer 116. For example, the second spacer layer 118 may be formed of silicon oxycarbonitride (SiOCN) having a dielectric constant lower than a dielectric constant of silicon nitride. The second spacer layer 118 may be formed to have a second thickness greater than the first thickness. The first and second spacer layers 116 and 118 may be formed to protect the dummy gate structures 112 during subsequent etching processes.

Figure 7:
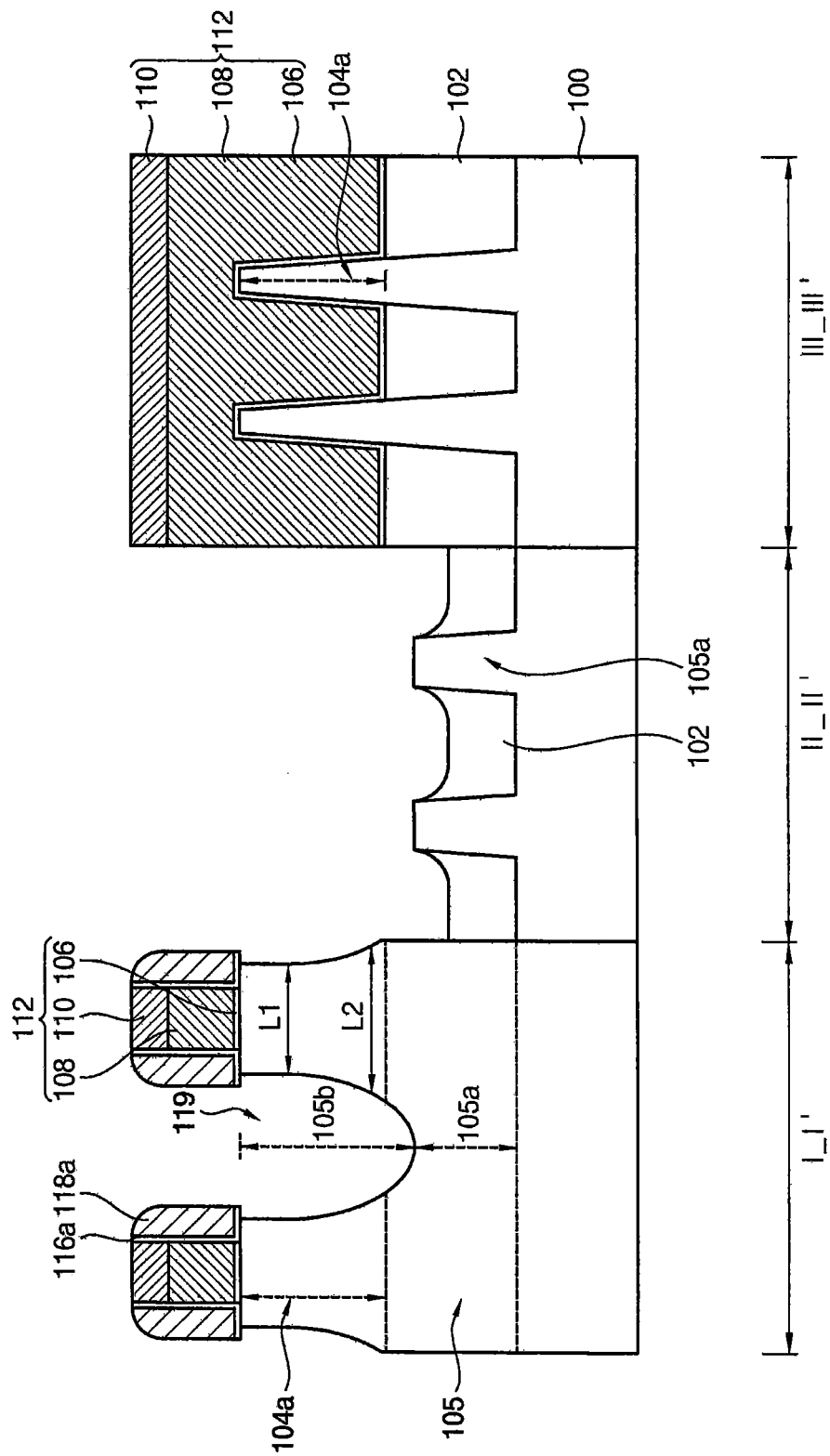

Referring to FIG. 7, the first and second spacer layers 116 and 118 may be anisotropically etched to form a spacer structure including a first spacer 116*a* and a second spacer 118*a* sequentially stacked on sidewalls of each of the dummy gate structures 112.

The preliminary active fin 104 may be partially removed using the dummy gate structures 112 and the first and second spacers 116*a* and 118*a* as an etch mask to form a recess 119. Thus, an active fin structure 105 may be formed to include a first pattern 105*a* extending in the first direction and a second pattern 105*b* protruding from a top surface of the first pattern 105*a*. The second pattern 105*b* may include a portion higher than an upper surface of the isolation layer 102 under the dummy gate structures 112, which may serve as an active fin 104*a*.

In some embodiments, a bottom of the recess 119 may be lower than the upper surface of the isolation layer 102 under the dummy gate structures 112.

In some embodiments, the etching process for forming the first and second spacers 116*a* and 118*a* and the etching process for forming the recess 119 may be performed in-situ.

The recess 119 may not be formed to have a vertical slope by the etching process. Thus, an upper portion of the recess 119 may have a width greater than a width of a lower portion of the recess 119, and the bottom of the recess 119 may have a round shape. The width of the lower portion of the recess 119 may decrease (e.g., gradually decrease) toward the bottom of the recess 119. The sidewall of the recess 119 may be a sidewall of the active fin 104*a*.

In some embodiments, the upper portion of the active fin 104a may have a first width L1 in the first direction, and the lower portion of the active fin 104a may have a second width L2 in the first direction greater than the first width L1.

A sidewall of the upper portion of the active fin 104a may have a first slope, and a sidewall of the lower portion of the active fin 104a may have a second slope gentler than the first slope. In some embodiments, the first slope may be in a range of about 80° to about 90°.

Figure 8:
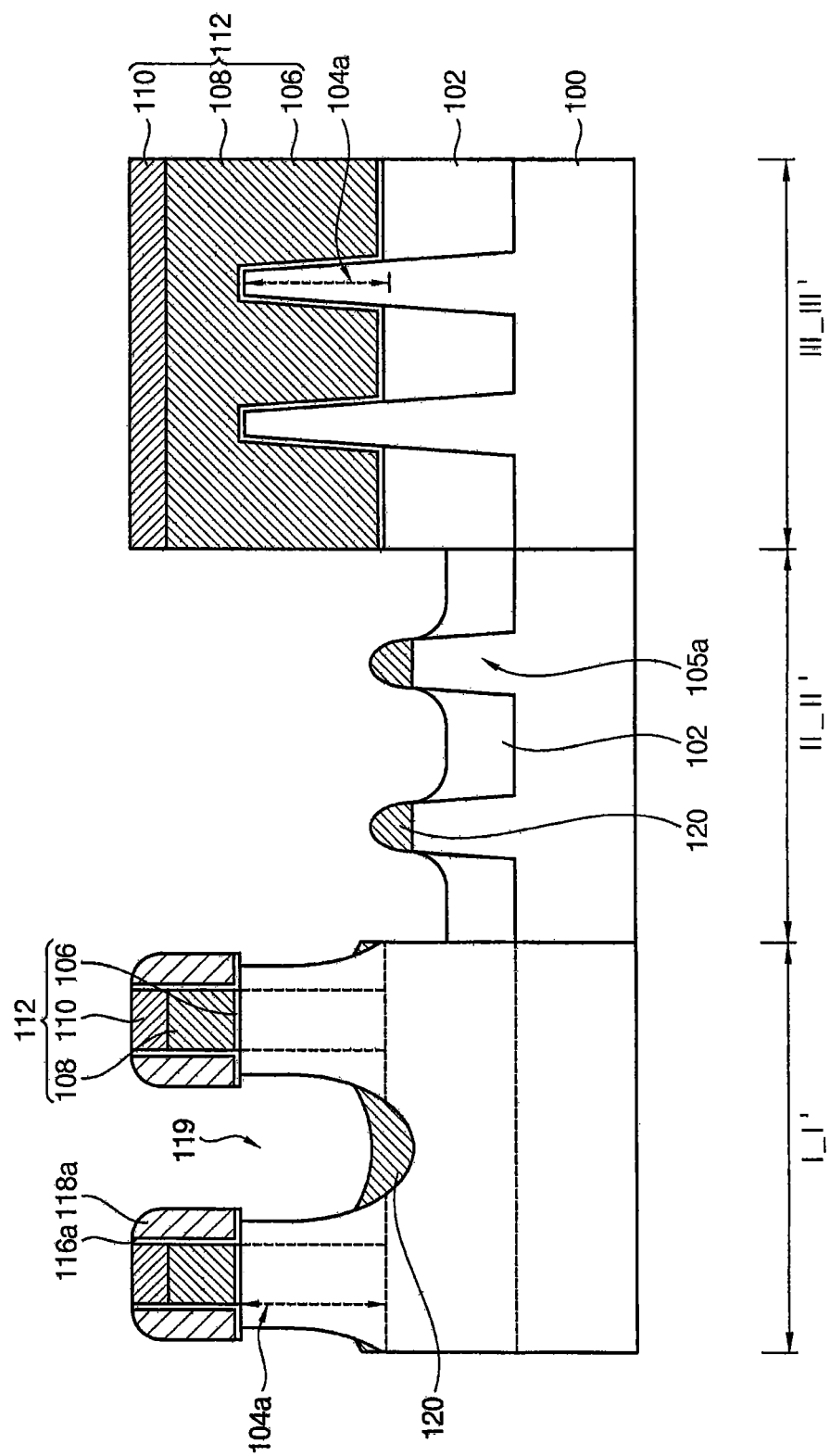

Referring to FIG. 8, a first epitaxial pattern 120 may be formed to fill the lower portion of the recess 119.

In some embodiments, a first selective epitaxial growth (SEG) process may be performed using a surface of the active fin structure 105 exposed by the bottom of the recess 119 as a seed to form the first epitaxial pattern 120.

The first epitaxial pattern 120 may be formed of silicon-germanium and may have a first germanium concentration. In some embodiments, the first germanium concentration may be in a range of about 5% to about 50%, preferably, in a range of about 5% to about 30%. That is, the first epitaxial pattern 120 may be formed to include the small amount of germanium, so that lattice defects due to the lattice mismatch between germanium of the first epitaxial pattern 120 and silicon of the active fin structure 105 may decrease.

In some embodiments, during the first SEG process, a first epitaxial growth rate in the third direction from the bottom of the recess 119 may be higher than a second epitaxial growth rate in a lateral direction from the sidewall of the recess 119. For example, the second epitaxial growth rate may be very small or even zero. In some embodiments, the first and second epitaxial growth rates in the first SEG process may be controlled by the type of a silicon source gas, the flow rate of an etching gas and a cleaning gas, and the pressure of a process chamber, etc. Thus, the first epitaxial pattern 120 may be formed to fill the lower portion of the recess 119.

In some embodiments, the first SEG process may be performed using a silicon source gas including monosilane ($SiH_4$), a germanium source gas including germanium hydride ($GeH_4$) and an etching gas and/or a cleaning gas including hydrogen chloride (HCl). In the first SEG process, the pressure may be in a range about 1 Torr to about 50 Torr.

The monosilane ($SiH_4$) gas may be directly injected in the third direction so that an epitaxial layer may be grown from the bottom of the recess 119. Thus, the first epitaxial pattern 120 may be formed to fill the lower portion of the recess 119.

In some embodiments, the first SEG process may be performed further using p-type dopants, e.g., $B_2H_6$ gas. Thus, the first epitaxial pattern 120 may be doped with p-type impurities to form a first impurity region having a first doping concentration. In some embodiments, the p-type impurities may include boron, and the first doing concentration may be about $1E17/cm^3$ to about $1E22/cm^3$.

A top surface of the first epitaxial pattern 120 may be located between a bottom of the active fin 104a and a central portion of the active fin 104a in the third direction. When the top surface of the first epitaxial pattern 120 is higher than the central portion of the active fin 104a in the third direction, a volume of the first epitaxial pattern 120 containing the small amount of germanium may increase, so that the strained stress applied to the active fin 104a may be reduced.

Figure 9:
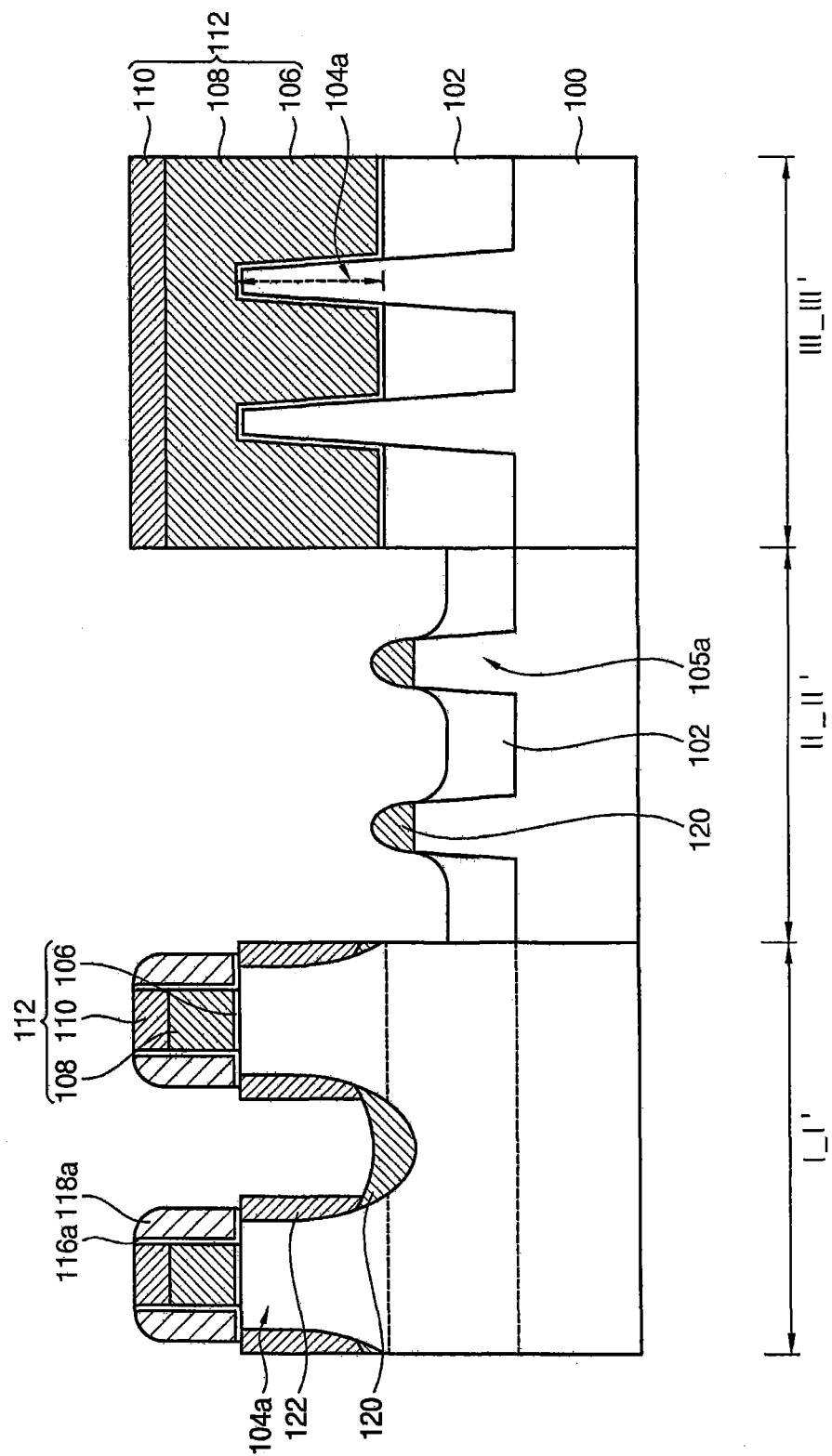

Referring to FIG. 9, a second epitaxial pattern 122 may be formed on a portion of the first epitaxial pattern 120 to cover an upper sidewall of the recess 119.

In some embodiments, a second SEG process may be performed using a surface of the active fin structure 105 exposed by a sidewall of the recess 119 as a seed to form the second epitaxial pattern 122.

The second epitaxial pattern 122 may be formed of silicon-germanium and may have a second germanium concentration. In some embodiments, the second germanium concentration may be in a range of about 5% to about 50%, preferably, in a range of about 5% to about 30%. In some embodiments, the second germanium concentration may be substantially the same as the first germanium concentration. In some embodiments, the second germanium concentration may be different from the first germanium concentration.

That is, the second epitaxial pattern 122 may be formed of a small amount of germanium so that lattice defects due to the lattice mismatch between germanium of the second epitaxial pattern 122 and silicon of the upper sidewall of the active fin 104a may decrease.

In some embodiments, during the second SEQ process, a third epitaxial growth rate in the lateral direction from the sidewall of the recess 119 may be higher than a fourth epitaxial growth rate in the third direction from a top surface of the first epitaxial pattern 120. For example, the fourth growth rate may be very small or even zero. Thus, the second epitaxial pattern 122 may be formed on the sidewall of the recess 119. In some embodiments, after the second SEQ process, a portion of the second epitaxial pattern 122 formed on the first epitaxial pattern may be selectively removed.

In some embodiments, the second SEG process may be performed using a silicon source gas including dichlorosilane ($SiCl_2H_2$), a germanium source gas including germanium hydride ($GeH_4$) and an etching gas and/or a cleaning gas including hydrogen chloride (HCl). The HCl gas may be provided at a flow rate higher than a flow rate of the HCl gas in the first SEG process. As the flow rate of the HCl gas increases, the fourth epitaxial growth rate may decrease. A pressure in the second SEG process may be higher than the pressure in the first SEG structure. In some embodiments, the pressure in the second SEQ process may be in a range about 100 Torr to about 200 Torr.

The dichlorosilane ($SiCl_2H_2$) gas may migrate along a sidewall of the recess 119, so that an epitaxial layer may be grown from the sidewall of the recess 119. Thus, the second epitaxial pattern 122 may be formed on the sidewall of the recess 119.

In some embodiments, the second SEG process may be performed further using p-type dopants, e.g., $B_2H_6$ gas. Thus, the second epitaxial pattern 122 may be doped with p-type impurities to form a second impurity region having a second doping concentration lower than the first doping concentration. In some embodiments, the p-type impurities may include boron, and the second doing concentration may be about $1E10/cm^3$ to about $1E21/cm^3$.

Figure 10:
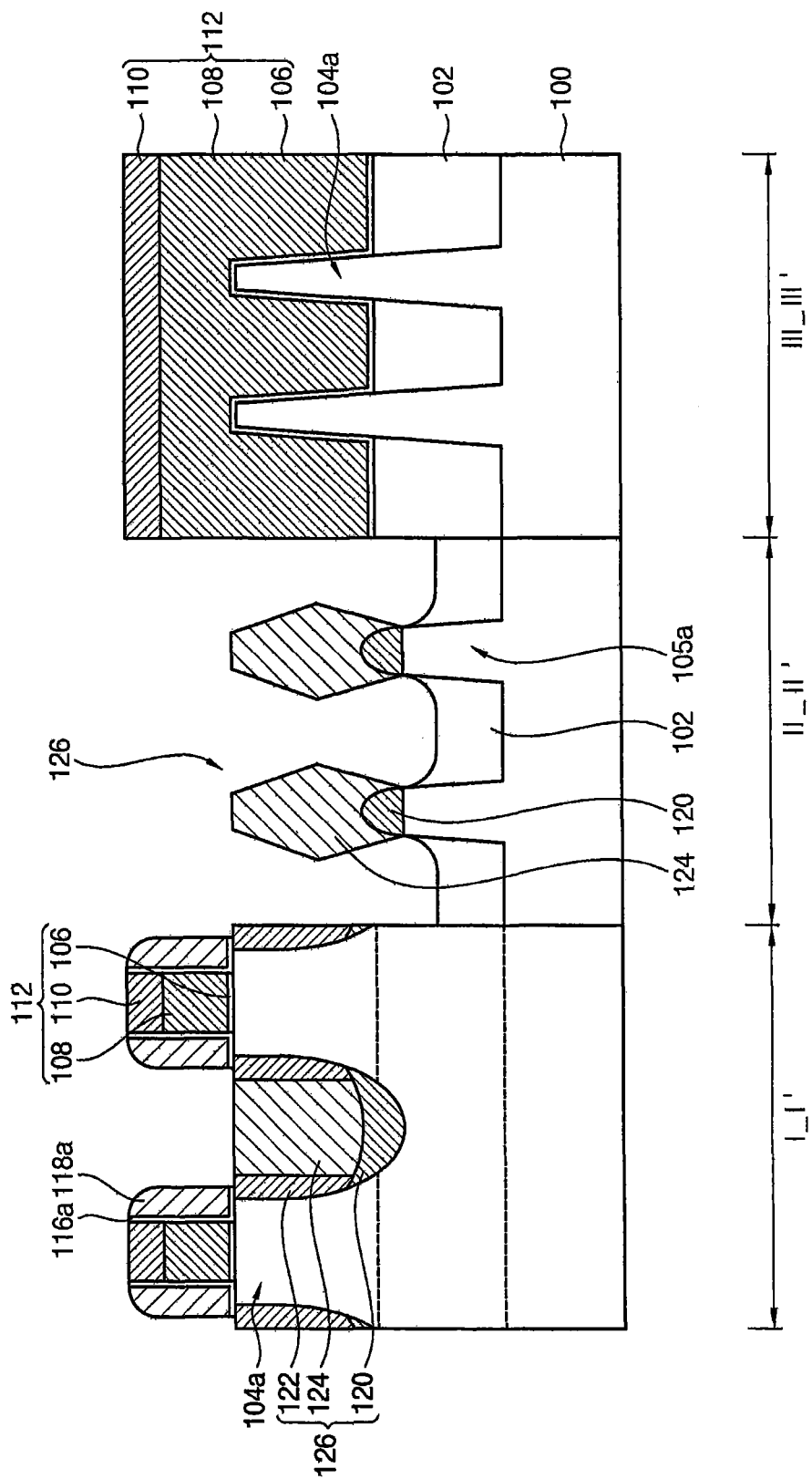

Referring to FIG. 10, a third epitaxial pattern 124 may be formed on the first and second epitaxial patterns 120 and 122 to fill a remaining portion of the recess 119.

In some embodiments, a third SEG process may be performed using surfaces of the first and second epitaxial patterns 120 and 122 as a seed to form the third epitaxial pattern 124.

The third epitaxial pattern 124 may be formed to include silicon-germanium and may have a third germanium concentration higher than the first and second germanium concentrations. In some embodiments, the third germanium concentration may be in a range of about 30% to about 80%, preferably, in a range of about 50% to about 60%. In some embodiments, each of a difference between the first and third germanium concentrations and a difference between the second and third germanium concentrations may be less than about 30%.

In some embodiments, the third SEG process may be performed using a silicon source gas including dichlorosilane ($SiCl_2H_2$), a germanium source gas including germanium hydride ($GeH_4$) and an etching gas and/or a cleaning gas including hydrogen chloride (HCl). A pressure in the third SEG process may be in a range about 1 Torr to about 50 Torr.

In some embodiments, the third SEG process may be performed under process conditions, e.g., source gas type, pressure, etc., which may be substantially the same as process conditions of the first SEG process. In some embodiments, the third SEG process may be performed under process conditions, e.g., source gas type, pressure, etc., which may be substantially the same as process conditions of the second SEG process. Only if an epitaxial layer may be formed to fill the remaining portion of the recess 119 by the third SEG process, the process conditions of the third SEG process may not be limited.

By the first to third SEG processes, an epitaxial structure 126 including the first to third epitaxial patterns 120, 122 and 124 may be formed. In some embodiments, the first to third SEG processes may be performed in-situ.

The first to third epitaxial patterns 120, 122 and 124 may be grown both in the vertical direction and the lateral direction. Thus, the epitaxial structure 126 may protrude from the active fin 104a in the recess 119 in the second direction. In some embodiments, the epitaxial structure 126 may have a cross-section taken along the second direction of which a shape may be pentagon, hexagon, or rhombus.

A plurality of epitaxial structures 126 may be formed in a plurality of recesses 119, respectively. In some embodiments, each of the third epitaxial patterns 124 may be formed such that the epitaxial structures 126 may be spaced apart from each other in the second direction. In some embodiments, each of the third epitaxial patterns 124 may be formed such that the epitaxial structures 126 may be connected to each other in the second direction to be merged into a single layer. In some embodiments, each of the third epitaxial patterns 124 may be formed such that some of the epitaxial structures 126 may be spaced apart from each other in the second direction and others of the epitaxial structures 126 may be connected to each other in the second direction.

Figure 11:
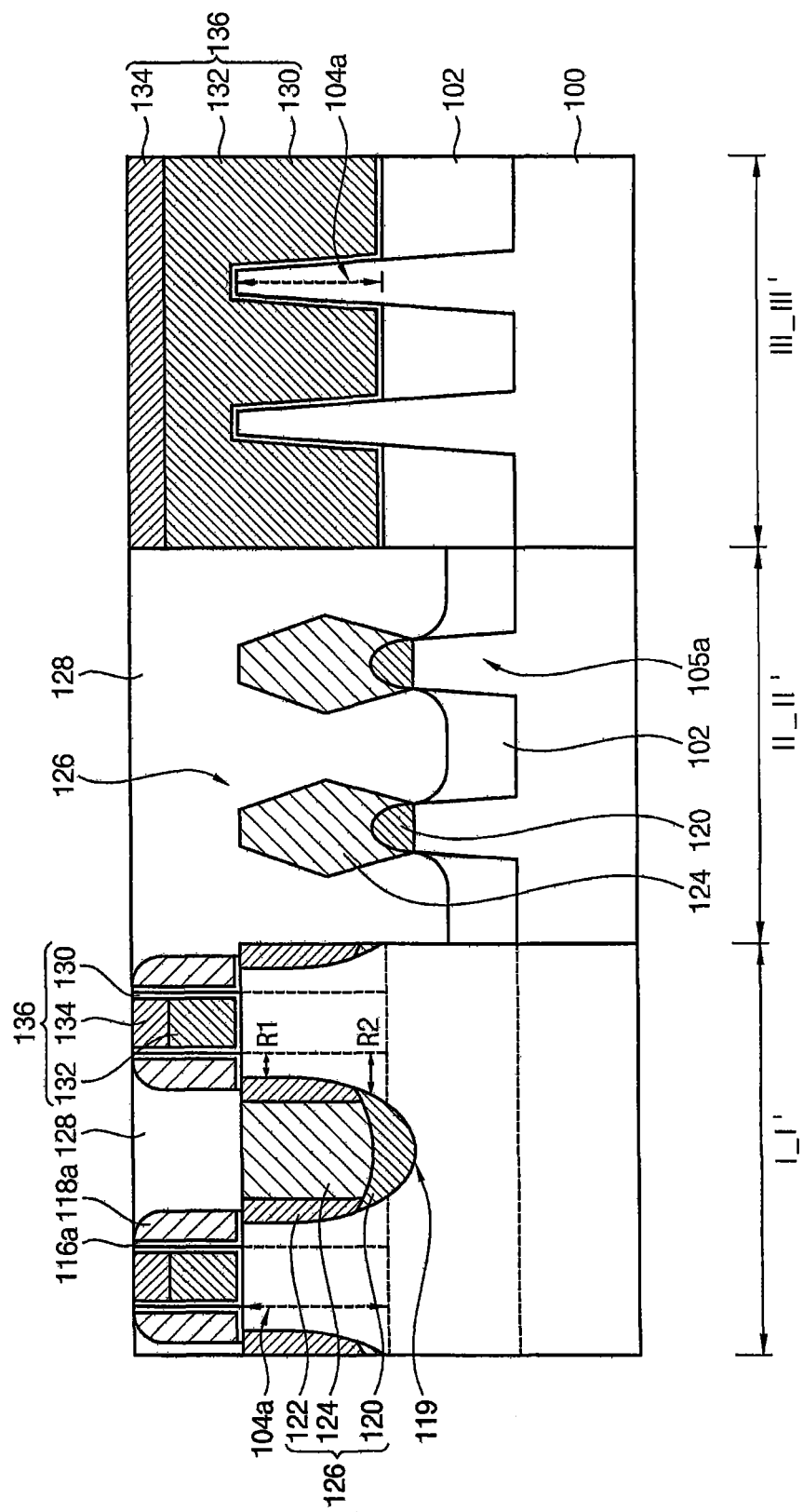

Referring to FIG. 11, an insulating interlayer 128 covering the dummy gate structures 112, the first and second spacers 116a and 118a, the epitaxial structure 126 and the isolation layer 102 may be formed on the substrate 100, and an upper portion of the insulating interlayer 128 may be planarized until top surfaces of the dummy gate structures 112 may be exposed. In some embodiments, the planarization process may be performed by a chemical mechanical polishing (CMP) process and/or an etch back process.

The exposed dummy gate structures 112 may be removed to form openings (not shown) each exposing a top surface of the active fin 104a. In some embodiments, the exposed top surface of the active fin 104a may be thermally oxidized to form a thermal oxide layer (not shown).

A gate structure 136 may be formed to fill each of the openings. The gate structure 136 may include a gate insulation pattern 130, a gate electrode 132 and a hard mask 134 sequentially stacked.

Particularly, a high-k dielectric layer may be formed on top surfaces of the thermal oxide layer and the isolation layer 102, sidewalls of the openings and a top surface of the insulating interlayer 128, and a gate electrode layer may be formed on the high-k dielectric layer to fill remaining portions of the openings.

The high-k dielectric layer may be formed of a metal oxide having a high dielectric constant, e.g., hafnium oxide, tantalum oxide, zirconium oxide, etc. The gate electrode layer may be formed of a material having a low resistance, e.g., a metal such as aluminum, copper, tantalum, etc., or a metal nitride thereof, by an ALD process, a physical vapor deposition (PVD) process, etc.

The gate electrode layer and the high-k dielectric layer may be planarized until the top surface of the insulating interlayer 128 may be exposed, and the gate electrode layer filling each of the openings may be partially etched. Thus, the gate insulation pattern 130 may be formed on the top surfaces of the thermal oxide layer and the isolation layer 102, and the sidewalls of the openings, and the gate electrode 132 may be formed on the gate insulation pattern 130 to fill a lower portion of each of the openings. In some embodiments, the planarization process may be performed by a CMP process and/or an etch back process. A hard mask layer may be formed on the gate electrode 132 and the gate insulation pattern 130 to fill a remaining portion of each of the openings, and the hard mask layer may be planarized until the top surface of the insulating interlayer 128 may be exposed to form the hard mask 134.

Thus, the gate insulation pattern 130, the gate electrode 132 and the hard mask 134 sequentially stacked may form the gate structure 136.

A contact structure (not shown) may be formed through the insulating interlayer 128 to contact a top surface of the epitaxial structure 126.

As described above, the first epitaxial pattern 120 may contact the lower portion of the active fin 104a having a relatively long channel length, and may include the first impurity region having the first doping concentration higher than the second doping concentration. Thus, an electrical resistance between the active fin 104a and the first epitaxial pattern 120 may decrease, and an effective channel region may be formed at the lower portion of the active fin 104a. As an area of the effective channel region increases, an operating current of the finFET may increase.

Figure 12:
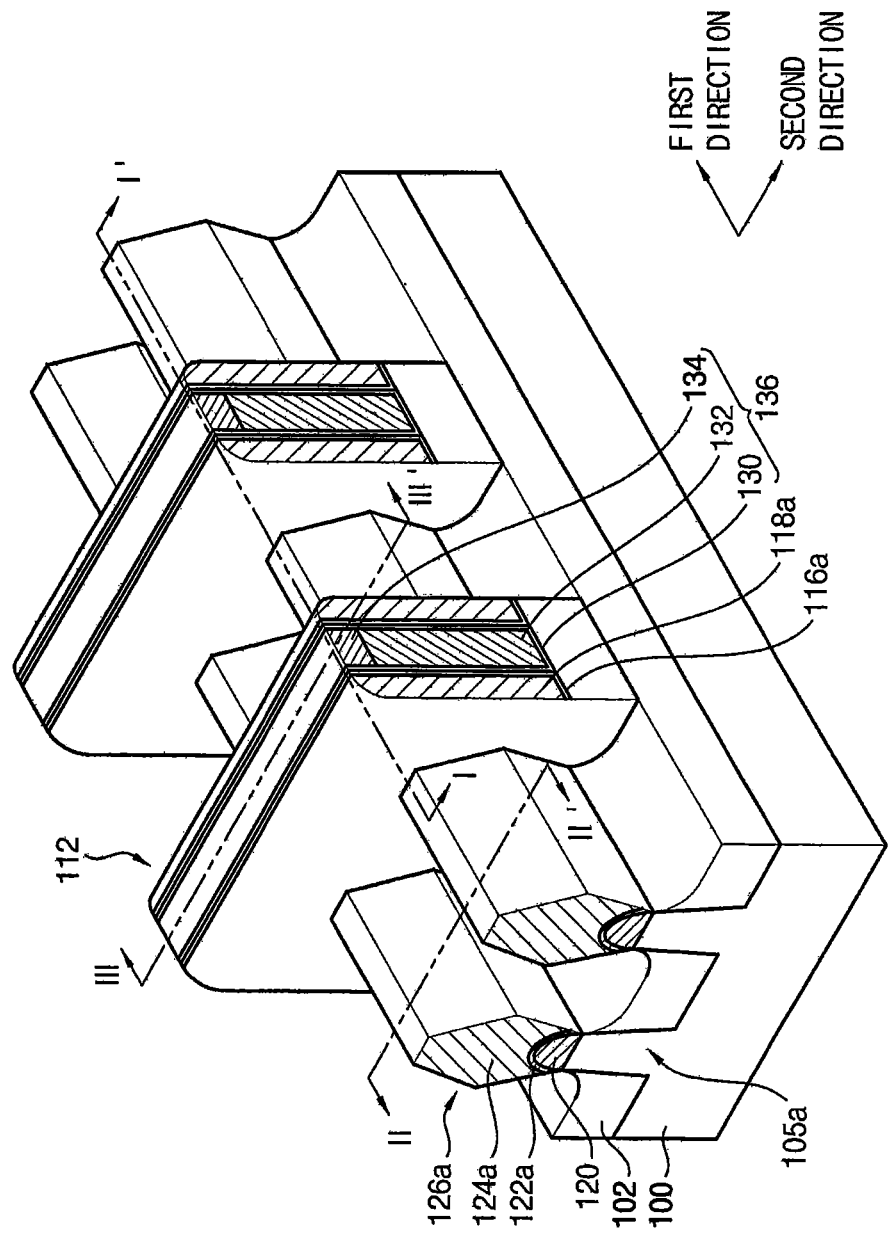
Figure 13:
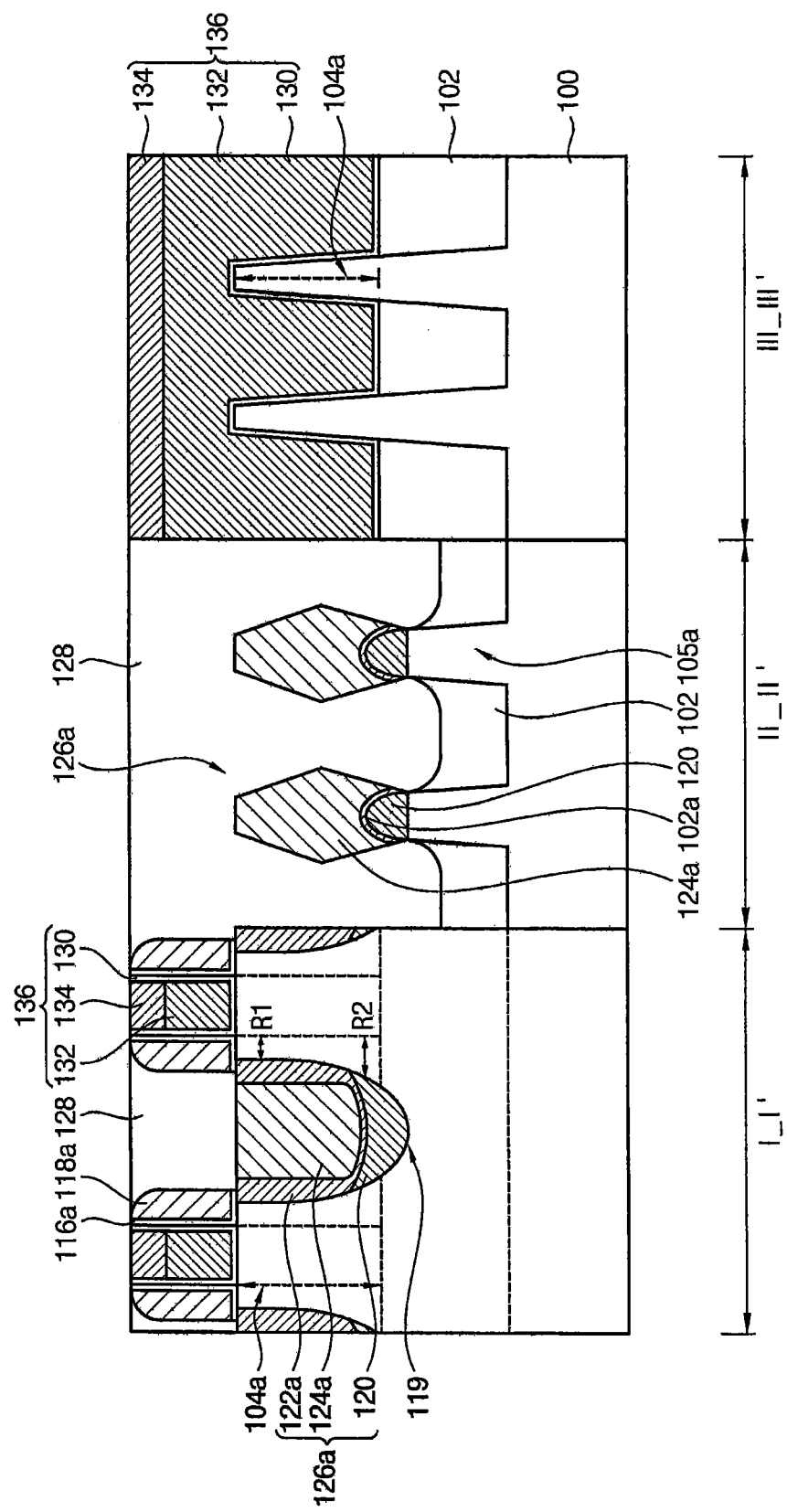
Figure 14:
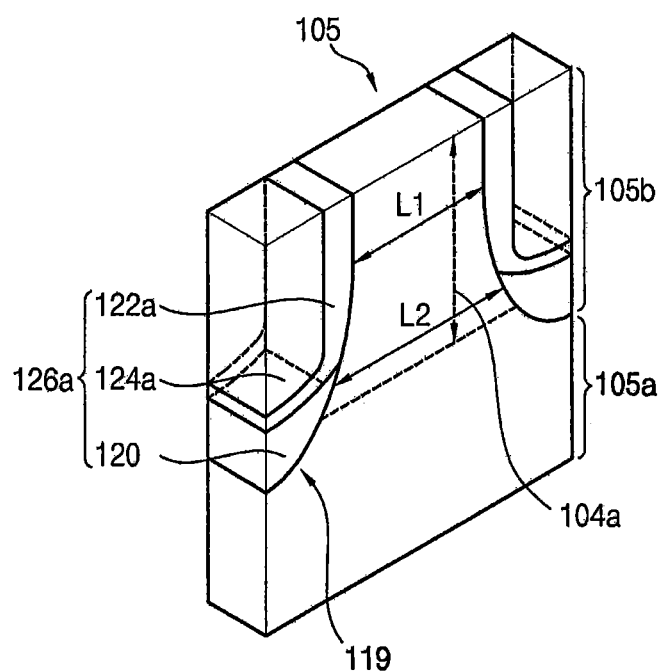

FIGS. 12 and 13 are a perspective view and a cross-sectional view, respectively, illustrating a semiconductor device including a FinFET in accordance with example embodiments. FIG. 14 is a perspective view illustrating of a portion of the semiconductor device including the FinFET. FIG. 13 includes cross-sectional views taken along lines I-I', II-II' and III-III', respectively, in FIG. 12. FIG. 14 illustrates portions of an active fin and an epitaxial structure of the semiconductor device in FIGS. 12 and 13.

The semiconductor device may be substantially the same as the semiconductor device of FIGS. 1, 2 and 3, except for the epitaxial structure. Thus, like reference numerals refer to like elements, and detailed descriptions thereon are omitted herein.

Referring to FIGS. 12, 13 and 14, the semiconductor device may include the substrate 100, the active fin structure 105, the gate structure 136 and an epitaxial structure 126a. The semiconductor device may further include the isolation layer 102 and the spacer structure.

The epitaxial structure 126a may include the first epitaxial pattern 120, a second epitaxial pattern 122a and a third epitaxial pattern 124a.

The first epitaxial pattern 120 may fill the lower portion of the recess 119. The first epitaxial pattern may be substantially the same as that illustrated with reference to FIGS. 1, 2 and 3.

That is, the first epitaxial pattern 120 may include silicon-germanium and may have the first germanium concentration. In some embodiments, the first germanium concentration may be in a range of about 5% to about 50%. The first epitaxial pattern 120 may include the first impurity region doped with impurities of the first doping concentration.

The second epitaxial pattern 122a may be conformally formed on an upper sidewall of the recess 119 and a top surface of the first epitaxial pattern 120. The second epitaxial pattern 122a may cover the top surface of the first epitaxial pattern 120.

A first thickness of a portion of the second epitaxial pattern 122a on the upper sidewall of the recess 119 may be less than a second thickness of a portion of the second epitaxial pattern 122a on the top surface of the first epitaxial pattern 120.

The second epitaxial pattern 122a may include silicon-germanium and may have a second germanium concentration. In some embodiments, the second germanium concentration may be in a range of about 5% to about 50%.

The second epitaxial pattern 122a may include a second impurity region doped with impurities of a second doping concentration lower than the first doping concentration.

The third epitaxial pattern 124a may be formed on the first and second epitaxial patterns 120 and 122a, and may fill a remaining portion of the recess 119.

The third epitaxial pattern 124a may include silicon-germanium and may have a third germanium concentration higher than the first and second germanium concentrations. In some embodiments, the third germanium concentration may be in a range of about 30% to about 80%. In some embodiments, each of the difference between the first and third germanium concentrations and the difference between the second and third germanium concentrations may be less than about 30%.

Figure 15:
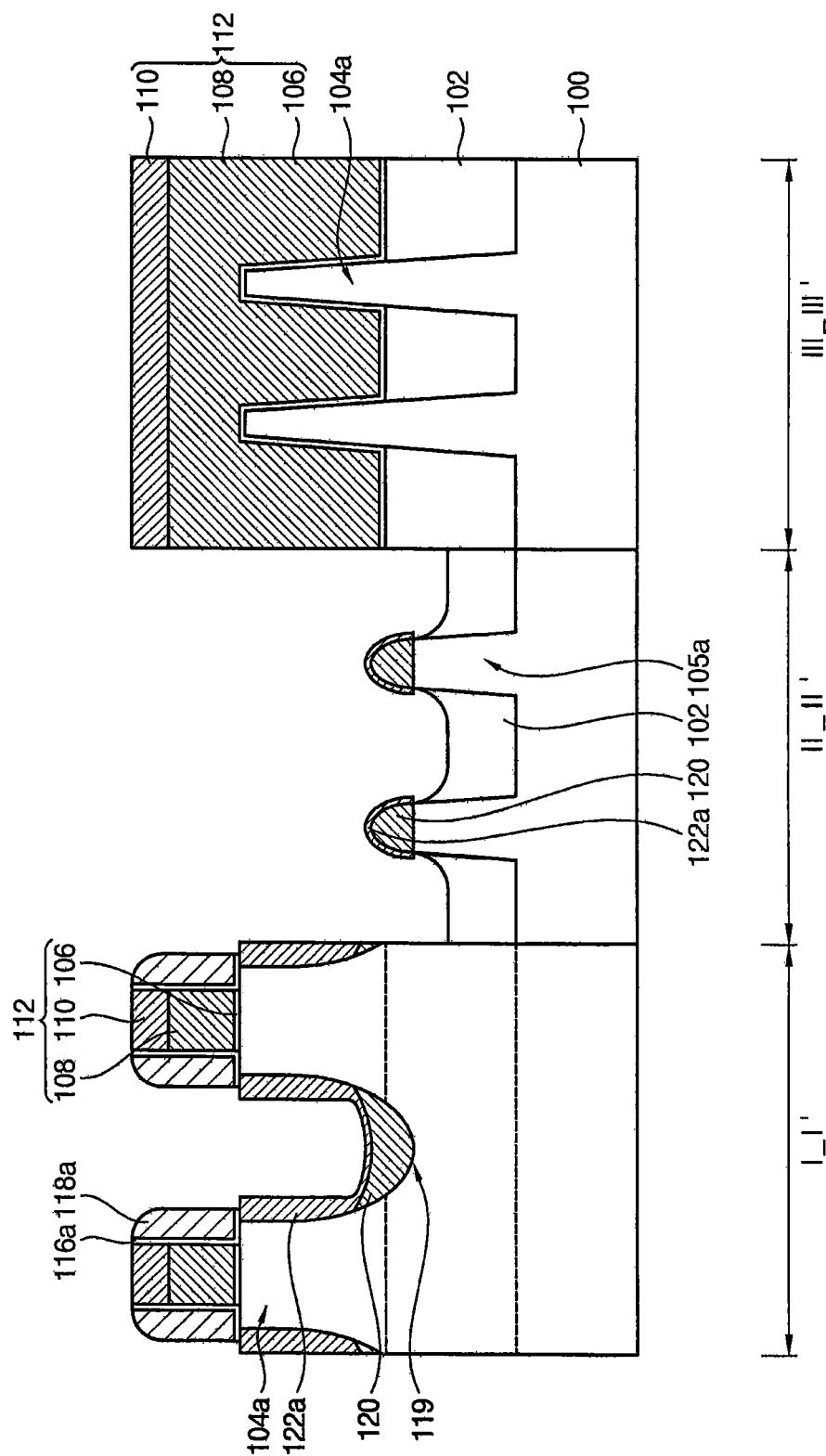
Figure 16:
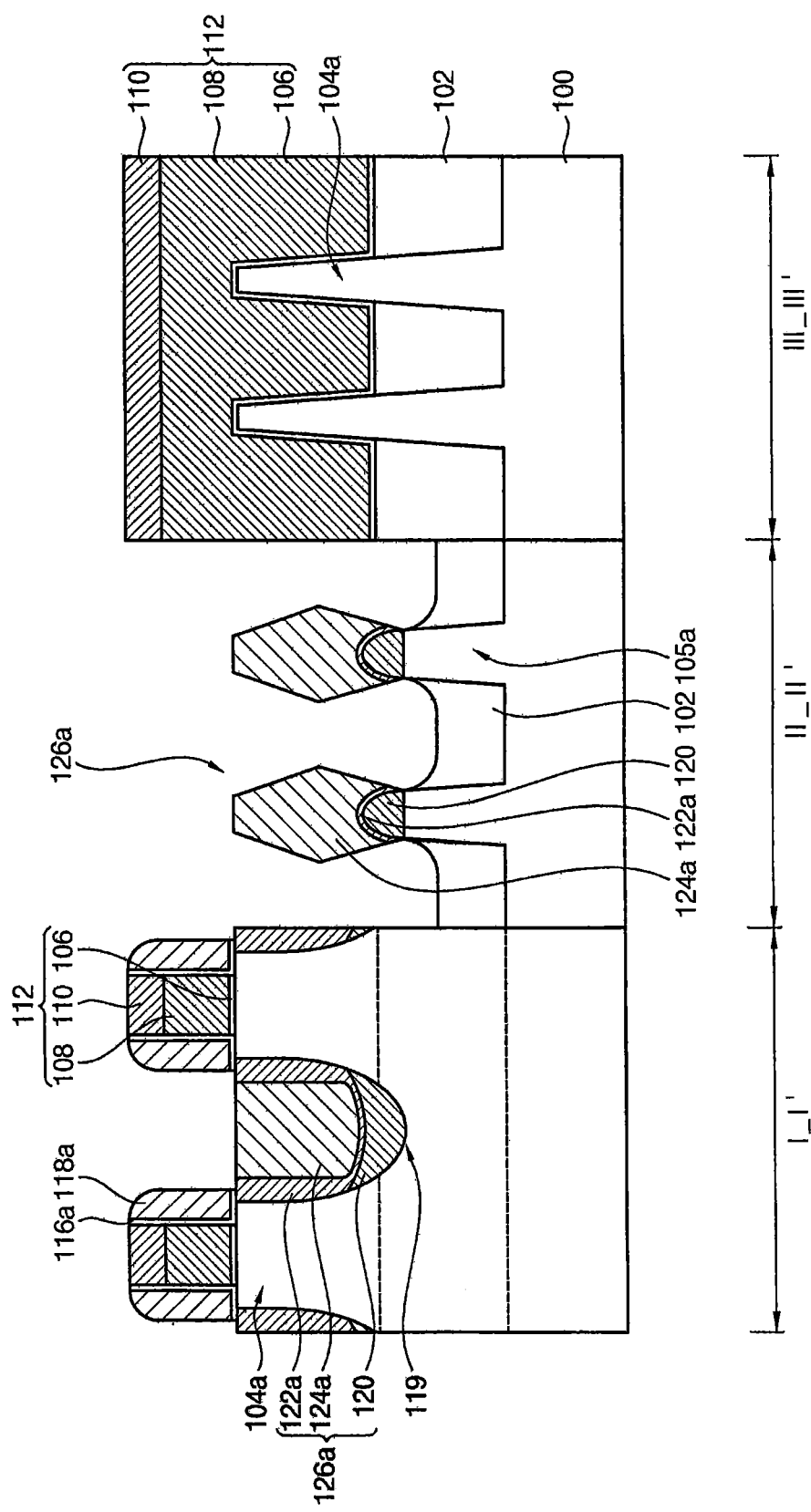

FIGS. 15 and 16 are cross-sectional views illustrating stages of a method of manufacturing a semiconductor device in accordance with example embodiments.

First, processes substantially the same as those illustrated with reference to FIGS. 4 to 8 may be performed.

Referring to FIG. 15, a second epitaxial pattern 122a may be formed on an upper sidewall of the recess 119 and a top surface of the first epitaxial pattern 120.

In some embodiments, a second SEG process may be performed using a surface of the active fin structure 105 exposed by a sidewall of the recess 119 and the top surface of the first epitaxial pattern 120 as a seed to form the second epitaxial pattern 122a. A portion of the second epitaxial pattern 122a on the upper sidewall of the recess may be formed to have a first thickness. A portion of the second epitaxial pattern 122a on the top surface of the first epitaxial pattern 120 may be formed to have a second thickness less than the first thickness.

The second SEG process may be substantially the same as or similar to the second SEG process illustrated with reference to FIG. 9. In the second SEG process, the flow rate of each of the germanium hydride ($GeH_4$) and the hydrogen chloride (HCl) may be controlled, so that the second epitaxial pattern 122a may be formed to cover the top surface of the first epitaxial pattern 120.

Referring to FIG. 16, a third epitaxial pattern 124a may be formed on the first and second epitaxial patterns 120 and 122a to fill a remaining portion of the recess 119. The third epitaxial pattern 124a may be formed by performing process substantially the same as or similar to the third SEG process illustrated with reference to FIG. 10.

After forming the third epitaxial pattern 124a, processes substantially the same as that illustrated with reference to FIG. 11 may be performed to manufacture the semiconductor device of FIGS. 12 and 13.

Figure 17:
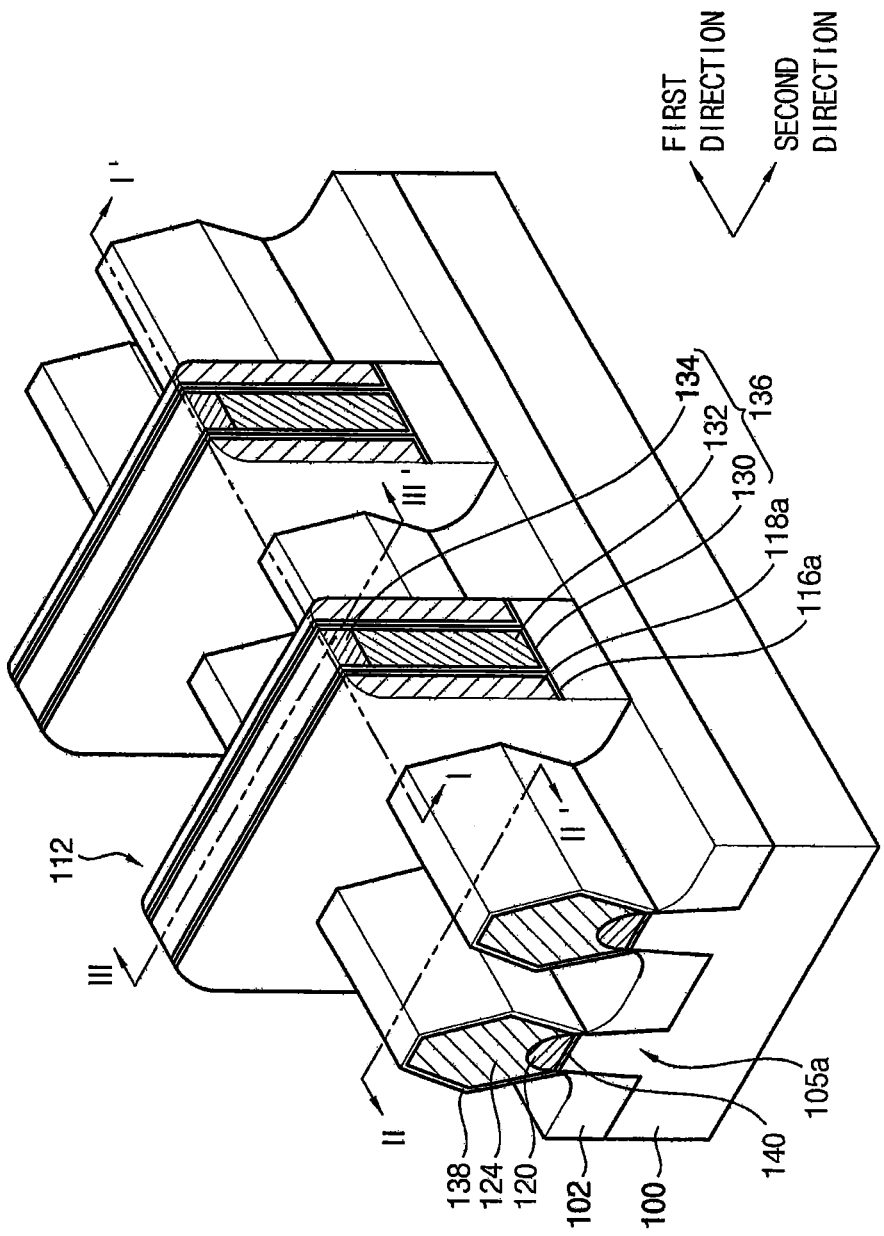
Figure 18:
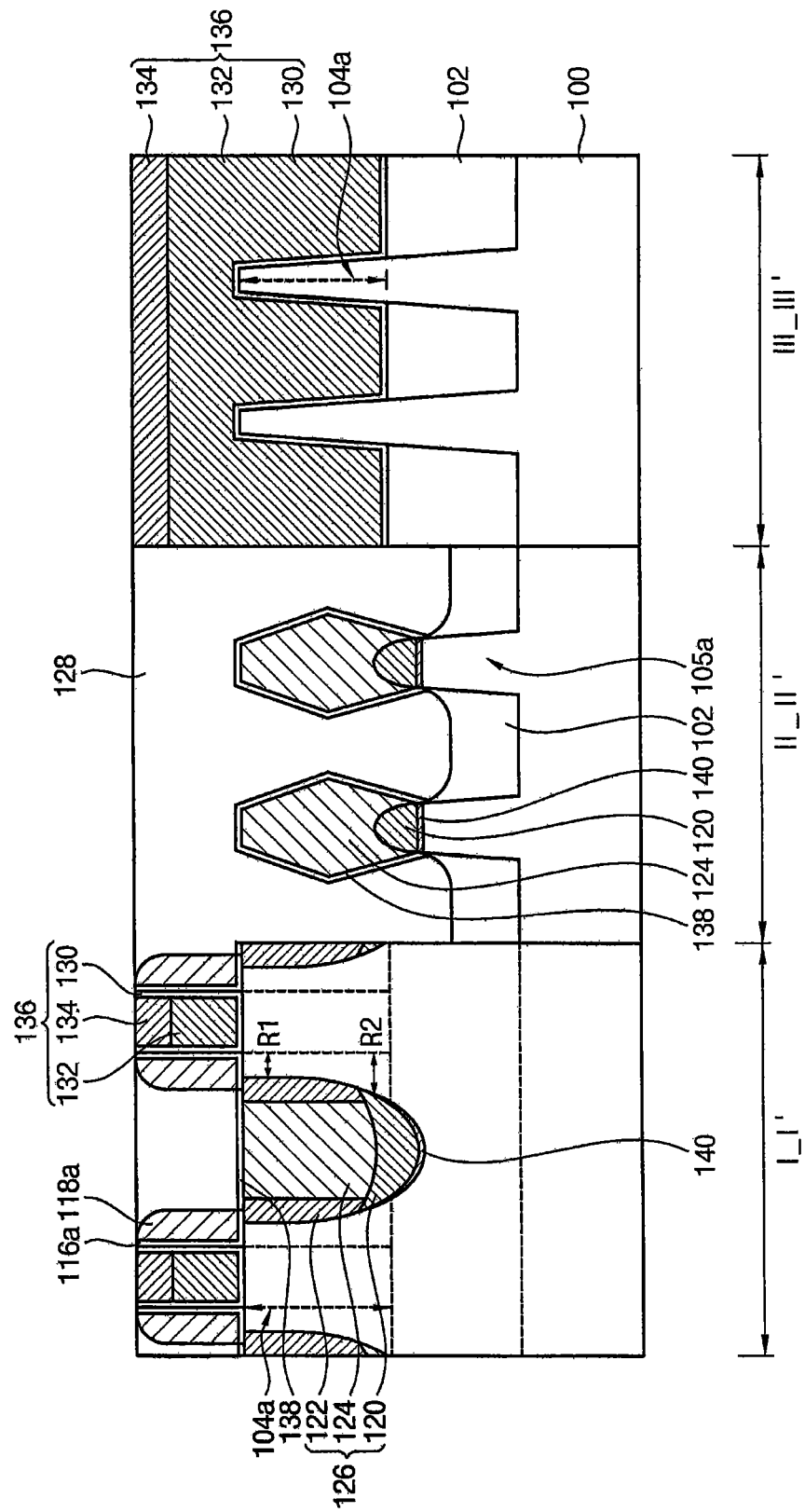
Figure 19:
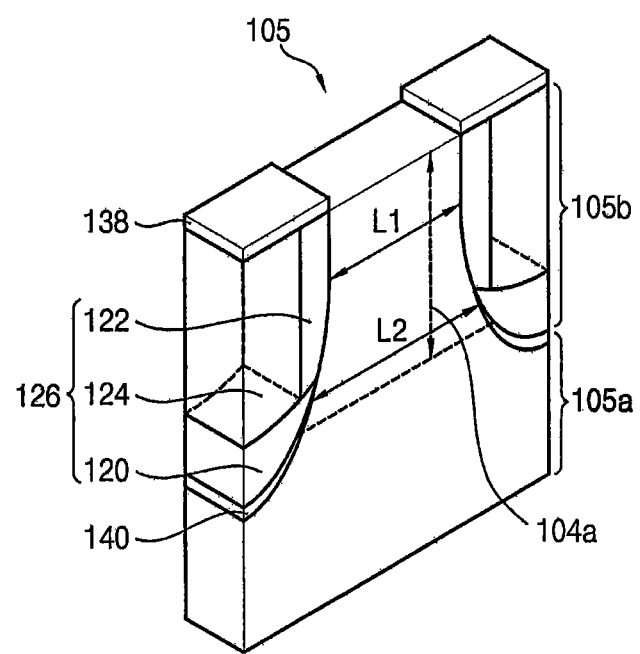

FIGS. 17 and 18 are a perspective view and a cross-sectional view, respectively, illustrating a semiconductor device including a FinFET in accordance with example embodiments. FIG. 19 is a perspective view illustrating of a portion of the semiconductor device including the FinFET. FIG. 18 includes cross-sectional views taken along lines I-I', II-II' and III-III', respectively, in FIG. 17. FIG. 19 illustrates portions of an active fin and an epitaxial structure of the semiconductor device in FIGS. 17 and 18.

The semiconductor device may be substantially the same as the semiconductor device of FIGS. 1, 2 and 3, except for a leakage blocking layer under the epitaxial structure and a capping layer on the epitaxial structure. Thus, like reference numerals refer to like elements, and detailed descriptions thereon are omitted herein.

Referring to FIGS. 17, 18 and 19, the semiconductor device may include the substrate 100, the active fin structure 105, the gate structure 136 and the epitaxial structure 126. The semiconductor device may further include a leakage blocking layer 140, a capping layer 138, the isolation layer 102 and the spacer structure.

The epitaxial structure 126 may include the first epitaxial pattern 120, the second epitaxial pattern 122 and the third epitaxial pattern 124.

The first, second and third epitaxial patterns 120, 122 and 124 may be substantially the same as those illustrated with reference to FIGS. 1,2 and 3, respectively.

The leakage blocking layer 140 may be formed under the first epitaxial pattern 120. That is, the leakage blocking layer 140 may be formed on a bottom of the recess 119. The leakage blocking layer 140 may include, for example, silicon oxide. When the leakage blocking layer 140 has a thickness more than about 50 Å, the first epitaxial pattern 120 may not be formed on the leakage blocking layer 140 by an epitaxial growth process. Thus, in some embodiments, the leakage blocking layer may have a thickness of about 3 Å to about 50 Å, preferably, about 10 Å to about 30 Å.

The leakage blocking layer 140 may be formed between the first epitaxial pattern 120 and a P-N junction of an active fin structure 105 under the first epitaxial pattern 120, and may serve as a barrier layer. As the leakage blocking layer 140 may be formed, leakage currents may decrease at a lower portion of the first epitaxial pattern 120.

The capping layer 138 may be formed on the epitaxial structure 126. The capping layer may include, for example, single crystalline silicon formed by a SEG process. In some embodiments, the capping layer 138 may have a thickness of about 5 Å to about 100 Å. The epitaxial structure 126 may be protected by the capping layer 138.

Figure 20:
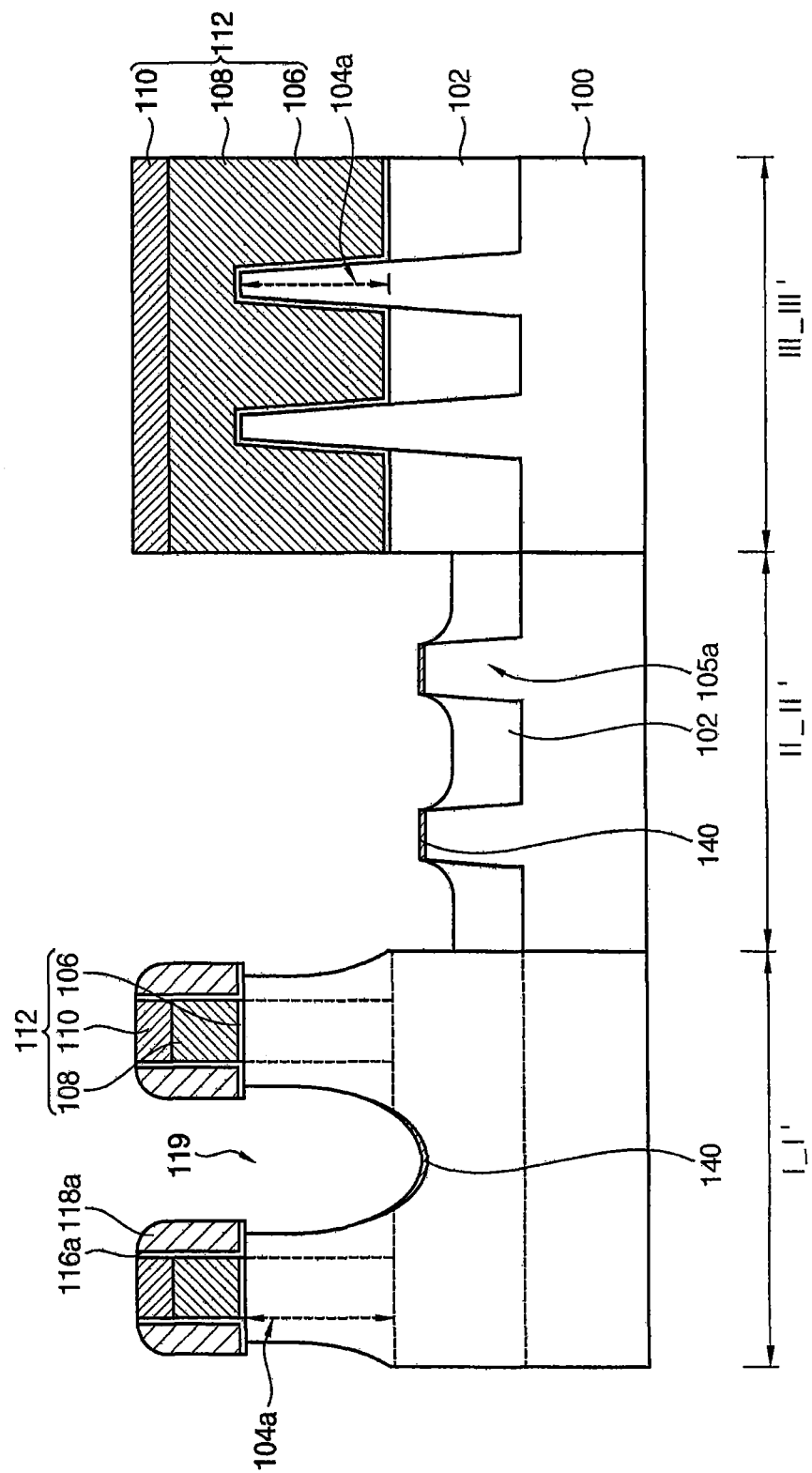
Figure 21:
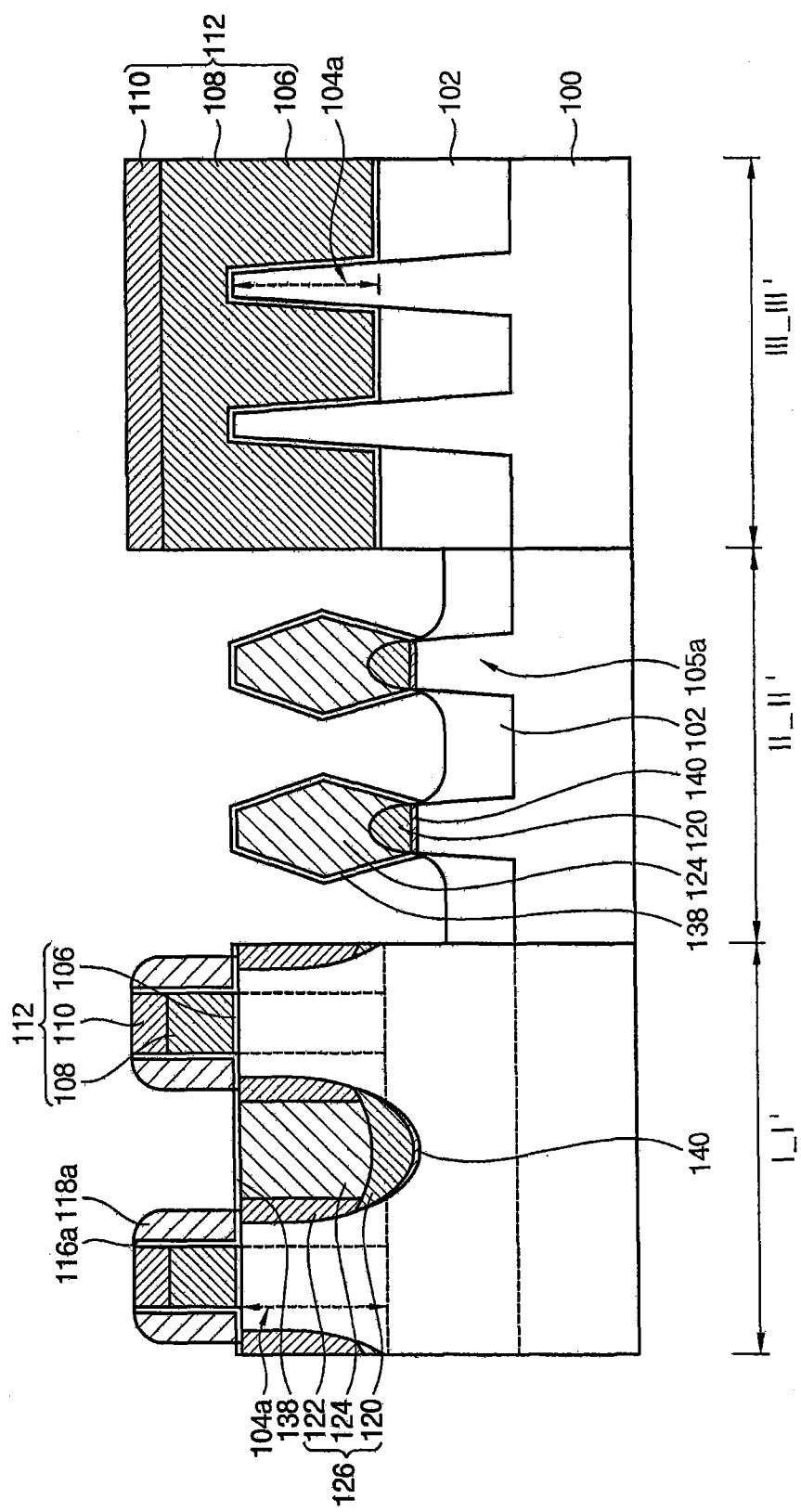

FIGS. 20 and 21 are cross-sectional views illustrating stages of a method of manufacturing a semiconductor device in accordance with example embodiments.

First, processes substantially the same as those illustrated with reference to FIGS. 4 to 7 may be performed.

Referring to FIG. 20, a leakage blocking layer 140 may be formed on a bottom of the recess 119. In some embodiments, the leakage blocking layer 140 may be formed to have a thickness of about 3 Å to about 50 Å, preferably, about 10 Å to about 30 Å.

The bottom of the recess 119 may include many dangling bonds and crystal defects due to a previous etching process for forming the recess 119, so that an oxygen gas may be reacted with the bottom of the recess 119 faster than other portions of the recess 119. Thus, the small amount of oxygen gas may be selectively reacted with the bottom of the recess 119, so that the leakage blocking layer 140 including silicon oxide may be formed on the bottom of the recess 119.

After forming the leakage blocking layer 140, processes substantially the same as those illustrated with reference to FIGS. 8 to 10 may be performed to form the epitaxial structure 126 including the first, second and third epitaxial patterns 120, 122 and 124 on the leakage blocking layer 140.

Referring to FIG. 21, a capping layer 138 may be formed on the epitaxial structure 126. In some embodiments, the capping layer 138 may be formed to have a thickness of about 5 Å to about 100 Å. The capping layer 138 may be formed of, for example, single crystalline silicon.

In some embodiments, a fourth SEG process may be performed using a surface of the epitaxial structure 126 as a seed to form the capping layer 138. In some embodiments, the fourth SEG process may be performed using a silicon source gas including disilane ($Si_2H_6$).

After forming the capping layer 138, processes substantially the same as those illustrated with reference to FIG. 11 may be performed to manufacture the semiconductor device of FIGS. 17 and 18.

The above semiconductor device may be applied to various types of systems, e.g., computing system.

Figure 22:
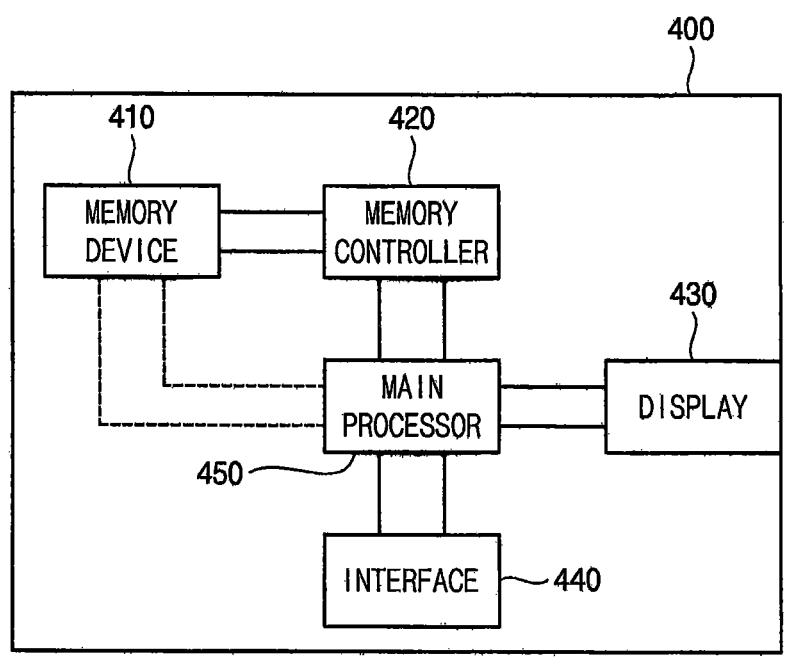

FIG. 22 is a block diagram illustrating a system in accordance with example embodiments.

Referring to FIG. 22, a system 400 may include a memory device 410, a memory controller 420 for controlling operations of the memory device 410, a displayer 430 for outputting data, an interface 440 for receiving data, and a main processor 450 for controlling elements in the system 400. The memory device 410 may include a semiconductor device in accordance with example embodiments. The memory device 410 may be directly connected to the main processor 450. The memory device 410 may be electrically connected to the main processor 450 via a bus. The system 400 may be applied to a computer, a portable computer, a laptop computer, a personal digital assistant, a tablet personal computer, a mobile phone, a digital music player, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including an active fin structure extending in a first direction, the active fin structure including protruding portions divided by a recess;
   a plurality of gate structures, each of the plurality of gate structures extending in a second direction crossing the first direction and covering the protruding portions of the active fin structure;
   a first epitaxial pattern in a lower portion of the recess between two of the plurality of gate structures;
   a second epitaxial pattern on a portion of the first epitaxial pattern, the second epitaxial pattern contacting a sidewall of the recess; and
   a third epitaxial pattern on the first epitaxial pattern, the third epitaxial pattern filling the recess,
   wherein the first epitaxial pattern includes a first impurity region having a first doping concentration,
   the second epitaxial pattern includes a second impurity region having a second doping concentration lower than the first doping concentration, and
   the third epitaxial pattern includes a third impurity region having a third doping concentration higher than the second doping concentration.

2. The semiconductor device of claim 1, wherein the recess has an upper portion and a lower portion, and the upper portion has a width greater than a width of the lower portion.

3. The semiconductor device of claim 1, wherein each of the first, second and third epitaxial patterns includes silicon-germanium, and wherein the first, second and third epitaxial patterns include germanium having a first germanium concentration, a second germanium concentration and a third germanium concentration, respectively.

4. The semiconductor device of claim 3, wherein each of the first and second germanium concentrations is lower than the third germanium concentration.

5. The semiconductor device of claim 4, wherein each of a difference between the first germanium concentration and the third germanium concentration and a difference between the second germanium concentration and the third germanium concentration is less than about 30%.

6. The semiconductor device of claim 3, wherein each of the first and second germanium concentrations is in a range of about 5% to about 50%.

7. The semiconductor device of claim 3, wherein each of the first and second germanium concentrations is in a range of about 30% to about 80%.

8. The semiconductor device of claim 1, wherein the third doping concentration is substantially the same as or higher than the first doping concentration.

9. The semiconductor device of claim 1, wherein the first, second and third impurity regions include p-type impurities.

10. The semiconductor device of claim 1, wherein each of the protruding portions of the active fin structure includes a first portion of which a sidewall is covered by an isolation layer, and a second portion on the first portion, and
    wherein a top surface of the first epitaxial pattern is higher than a bottom of the second portion of the active fin structure and is lower than a central portion of the second portion of the active fin structure in a vertical direction.

11. The semiconductor device of claim 1, further comprising a leakage blocking layer on a bottom of the recess, the leakage blocking layer including silicon oxide.

12. The semiconductor device of claim 11, wherein the leakage blocking layer has a thickness of about 3 Å to about 50 Å.

13. The semiconductor device of claim 1, wherein the second epitaxial pattern conformally extends on the sidewall of the recess and a top surface of the first epitaxial pattern,
wherein a portion of the second epitaxial pattern on the sidewall of the recess has a first thickness, and
wherein a portion of the second epitaxial pattern on the top surface has a second thickness less than the first thickness.

14. The semiconductor device of claim 1, wherein the second epitaxial pattern is disposed only on the sidewall of the recess, and
wherein the third epitaxial pattern contacts a sidewall of the second epitaxial pattern when viewed in cross-section.

15. The semiconductor device of claim 1, further comprising a capping layer on surfaces of the second and third epitaxial patterns, the capping layer including single crystalline silicon.

16. A semiconductor device, comprising:
a substrate including an active fin structure extending in a first direction, the active fin structure including protruding portions divided by a recess;
a plurality of gate structures, each of the gate structures extending in a second direction crossing the first direction and covering the protruding portions of the active tin structure;
a first epitaxial pattern in a lower portion of the recess between two of the plurality of gate structures;
a second epitaxial pattern on a portion of the first epitaxial pattern, the second epitaxial pattern contacting a sidewall oldie recess; and
a third epitaxial pattern on the first epitaxial pattern, the third epitaxial pattern filling the recess and contacting a sidewall of the second epitaxial pattern when viewed in cross-section,
wherein each of the first, second and third epitaxial patterns includes silicon-germanium, and
wherein a concentration of germanium in the third epitaxial pattern is higher than a concentration of germanium in each of the first and second epitaxial patterns.

17. The semiconductor device of claim 16, further comprising a leakage blocking layer on a bottom of the recess, the leakage blocking layer including silicon oxide.

18. The semiconductor device of claim 16, wherein each of the protruding portions of the active fin structure includes a first portion of which a sidewall is covered by an isolation layer, and a second portion on the first portion, and
wherein a top surface of the first epitaxial pattern is higher than a bottom of the second portion of the active fin structure and is lower than a central portion of the second portion of the active fin structure in a vertical direction.

19. The semiconductor device of claim 16, wherein the recess has an upper portion and a lower portion, and the upper portion has a width greater than a width of the lower portion.

20. A semiconductor device, comprising:
a substrate including an active fin structure extending in a first direction, the active fin structure including protruding portions divided by a recess;
a plurality of gate structures, each of the gate structures extending in a second direction crossing the first direction and covering the protruding portions of the active fin structure;
a first epitaxial pattern in a lower portion of the recess between two of the plurality of gate structures;
a second epitaxial pattern on a portion of the first epitaxial pattern, the second epitaxial pattern contacting a sidewall of the recess; and
a third epitaxial pattern on the first epitaxial pattern, the third epitaxial pattern filling the recess and contacting a sidewall of the second epitaxial pattern when viewed in cross-section,
wherein the first, second and third epitaxial patterns include a first impurity region, a second impurity region and a third impurity region, respectively, and
wherein an impurity concentration of the second impurity region is lower than an impurity concentration of each of the first and third impurity regions.

* * * * *